US007015696B2

(12) United States Patent
Kabasawa

(10) Patent No.: US 7,015,696 B2
(45) Date of Patent: Mar. 21, 2006

(54) MAGNETIC RESONANCE IMAGING APPARATUS AND MAGNETIC RESONANCE IMAGING METHOD

(75) Inventor: Hiroyuki Kabasawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/017,256

(22) Filed: Dec. 20, 2004

(65) Prior Publication Data

US 2005/0134266 A1    Jun. 23, 2005

(30) Foreign Application Priority Data

Dec. 22, 2003    (JP) ............................. 2003-424441

(51) Int. Cl.
*G01V 3/00* (2006.01)

(52) U.S. Cl. ...................................... 324/318; 324/309

(58) Field of Classification Search ................ 324/309, 324/307, 312, 318, 319, 322, 300; 600/410
See application file for complete search history.

(56) References Cited

U.S. PATENT DOCUMENTS

| 4,812,753 | A |   | 3/1989  | Fuderer et al. |
|-----------|---|---|---------|----------------|
| 5,027,070 | A |   | 6/1991  | Higuchi |
| 5,551,431 | A |   | 9/1996  | Wells, III et al. |
| 5,600,244 | A |   | 2/1997  | Jensen et al. |
| 5,635,837 | A |   | 6/1997  | Bornert |
| 5,659,629 | A |   | 8/1997  | Cline |
| 5,864,234 | A |   | 1/1999  | Ludeke |
| 6,326,786 | B1| * | 12/2001 | Pruessmann et al. ....... 324/312 |
| 6,424,154 | B1|   | 7/2002  | Young |
| 6,433,547 | B1|   | 8/2002  | Kabasawa et al. |
| 6,559,642 | B1|   | 5/2003  | King |
| 6,605,943 | B1| * | 8/2003  | Clark et al. ................. 324/309 |
| 6,668,184 | B1|   | 12/2003 | Kleiman |
| 6,823,205 | B1|   | 11/2004 | Jara |

OTHER PUBLICATIONS

European Search Report; Munich; Sep. 19, 2005; Application No. 04257833.6—2209 PCT; Reference 158181/10440; 3 pgs.

H.K. Mathiesen et al.; Multi-Slice Echo Planar Spectroscopic Imaging in Multiple Sclerosis; BNSDOCID:XP002342796A; Proc Intl Soc Mag Reson Med 11 (2003); 1 pg.

Narayana et al; Effect of Radio Frequency Inhomogeneity Correction on the Reproducibility of Intra-Cranial Volumes Using MR Image Data; XP2342797A; MRM33:396-400 (1995).

* cited by examiner

*Primary Examiner*—Brij B. Shrivastav
(74) *Attorney, Agent, or Firm*—Carl B. Horton, Esq.; Armstrong Teasdale LLP

(57) ABSTRACT

A method for calculating a sensitivity distribution of a receive coil and taking a tomographic image of a subject, based on magnetic resonance signals received by a surface coil in an imaging sequence with a plurality of different echo times TE1 and TE2 in a reference scan, a plurality of reference images are produced by a first reference image producing section; and based on the plurality of reference images, a T2 relaxation time is calculated by a T2 relaxation time calculating section. Then, based on the calculated T2 relaxation time, a T2-weighted image at the echo time TE2 is calculated by a T2-weighted image calculating section, and thereafter, based on the reference image and T2-weighted image at the echo time TE2, a sensitivity distribution is calculated by a sensitivity distribution calculating section. Based on the sensitivity distribution, a tomographic image by an actual scan is corrected by a correcting section.

20 Claims, 10 Drawing Sheets

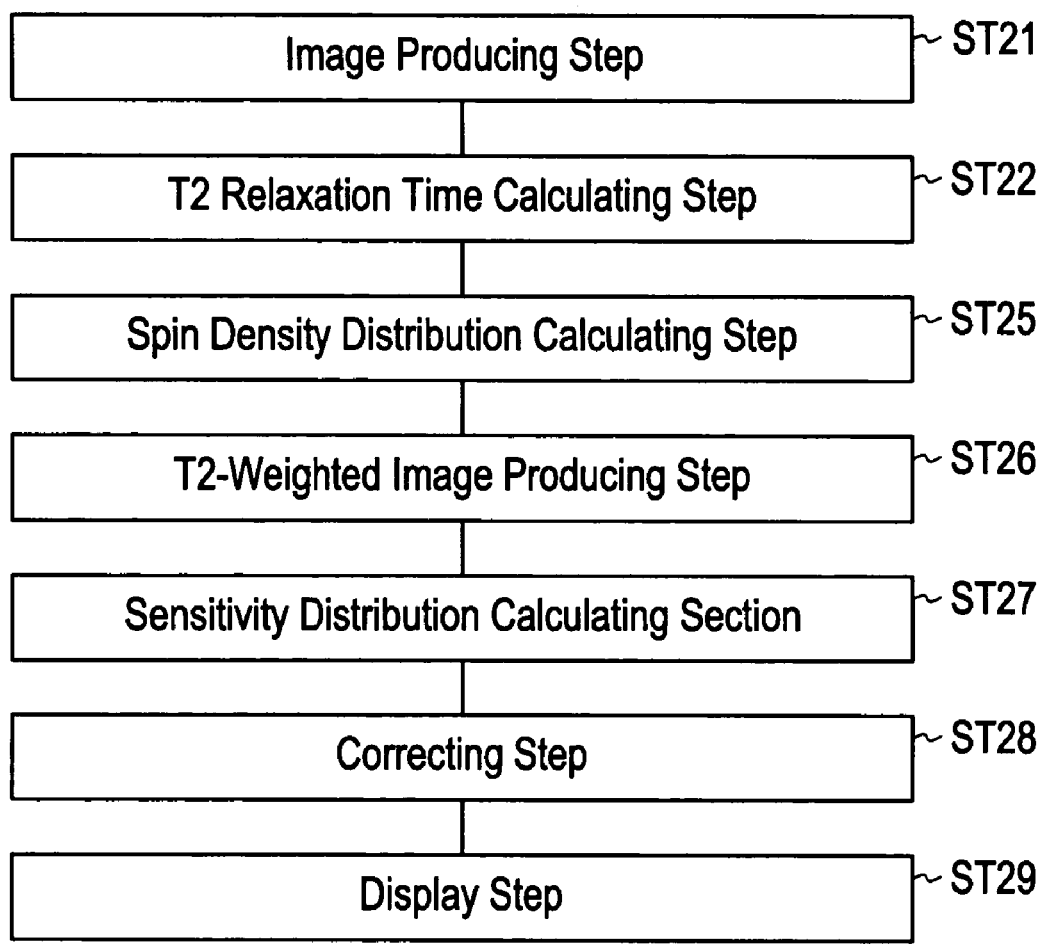

MAGNETIC RESONANCE IMAGING APPARATUS AND MAGNETIC RESONANCE IMAGING METHOD

CROSS REFERENCE TO RELATED APPLICATIONS

This application claims the benefit of Japanese Application No. 2003-424441 filed Dec. 22, 2003.

BACKGROUND OF THE INVENTION

The present invention relates to a magnetic resonance imaging apparatus and magnetic resonance imaging method, and more particularly to a magnetic resonance imaging apparatus and magnetic resonance imaging method for correcting a tomographic image of an imaged region in a subject produced based on magnetic resonance signals emitted from the imaged region and received by a receive coil in an actual scan, with reference to a sensitivity distribution of the receive coil in the imaged region created in a reference scan.

Magnetic resonance imaging (MRI) apparatuses are widely used especially in medical applications because of their capability of capturing a tomographic image of a subject using the nuclear magnetic resonance (NMR) phenomenon.

In a magnetic resonance imaging apparatus, the subject is placed within a static magnetic field, whereby the direction of spins of protons in the subject is aligned with the direction of the static magnetic field to yield a magnetization vector, and electromagnetic waves of a resonance frequency are then applied to give rise to the nuclear magnetic resonance phenomenon in which the magnetization vector of the protons changes. Thereafter, the magnetic resonance imaging apparatus receives magnetic resonance (MR) signals generated when the protons recover their original magnetization vector, and produces a tomographic image of the subject based on the received magnetic resonance signals.

Receive coils for receiving the magnetic resonance signals in such a magnetic resonance imaging apparatus include a surface coil, which is often used because of its high S/N ratio and high sensitivity, and capability of preventing aliasing artifacts. The surface coil has, however, a property of decreasing reception sensitivity with increasing distance from the magnetic resonance signal source in the subject, and its sensitivity distribution is not uniform over the whole imaged region. Thus, there is a problem of a tomographic image produced based on magnetic resonance signals received by the surface coil becoming non-uniform.

In the prior art, a variety of methods are proposed to address this problem (for example, see Patent Document 1).

[Patent Document 1] U.S. Pat. No. 4,812,753, specification.

In the conventional techniques for addressing the problem caused by sensitivity non-uniformity of the surface coil, a reference scan is conducted in addition to an actual scan to calculate the sensitivity distribution of the surface coil in the imaged region, and a tomographic image produced by the actual scan is corrected based on the calculated sensitivity distribution.

In one of such conventional techniques, a reference scan is first conducted using a surface coil as a receive coil to image an imaged region in a subject according to a predefined imaging sequence, and a first reference image Is(x, y) is produced corresponding to pixel positions (x, y). Moreover, another reference scan is similarly conducted using a volume coil as a receive coil having a uniform sensitivity over the whole imaged region to image the imaged region in the subject according to a predefined imaging sequence, and a second reference image Ib(x, y) is produced. The first reference image Is(x, y) and second reference image Ib(x, y) are then subjected to processing for removing noise.

Next, as given by Equation (1) below, the first reference image Is(x, y) and second reference image Ib(x, y) are used to calculate a sensitivity distribution Hs(x, y) of the surface coil. The calculated sensitivity distribution H(x, y) is subjected to extrapolation or interpolation, and low-pass filtering in which lower frequency components are passed.

$$Hs(x, y) = Is(x, y)/Ib(x, y) \quad (1)$$

Next, as given by Equation (2) below, a tomographic image Isa(x, y) produced in an actual scan using the surface coil is corrected by the sensitivity distribution Hs(x, y) to obtain a corrected tomographic image Isa'(x, y).

$$Isa'(x, y) = Isa(x, y)/Hs(x, y) \quad (2)$$

Based on the corrected tomographic image Isa'(x, y), an image is displayed on a display section comprising a display device such as a graphic display.

In the conventional technique as described above, a plurality of reference images are captured using both the surface coil and volume coil prior to an actual scan, and the sensitivity distribution of the surface coil over the whole imaged region is calculated using the reference image by the volume coil. The calculated sensitivity distribution is then used to correct a tomographic image produced by the surface coil so that a uniform tomographic image can be obtained.

The volume coil, however, sometimes has a markedly non-uniform sensitivity distribution due to the permittivity effect especially when used in an ultra-high magnetic field of 3 Teslas or more, and at that time it cannot produce an adequately uniform image. Thus, when the sensitivity distribution of a surface coil is calculated using an image by the volume coil, the sensitivity distribution of the surface coil is sometimes inaccurately calculated.

Moreover, an open magnetic resonance imaging apparatus, for example, is sometimes not equipped with a receive coil having the high sensitivity uniformity of a volume coil or the like. In such a case, the sensitivity distribution of a surface coil over the whole imaged region as described above cannot be calculated beforehand, because there is no receive coil having a uniform sensitivity.

In the conventional techniques, as described above, the sensitivity distribution of the receive coil is sometimes inaccurately calculated, and it is sometimes difficult to capture an accurate tomographic image of a subject.

BRIEF DESCRIPTION OF THE INVENTION

It is therefore an object of the present invention to provide a magnetic resonance imaging apparatus and magnetic resonance imaging method that facilitates accurate calculation of the sensitivity distribution of a receive coil, and facilitates accurate tomographic imaging on a subject.

To attain the aforementioned object, a magnetic resonance imaging apparatus of the present invention is for correcting a tomographic image of an imaged region of a subject produced based on magnetic resonance signals received by a receive coil in an actual scan, with reference to a sensitivity distribution of said receive coil in said imaged region created in a reference scan, and said apparatus comprises: first reference image producing means for, based on said magnetic resonance signals from said imaged region received by said receive coil in a predefined imaging sequence with a plurality of different echo times in said reference scan, producing reference images respectively at said plurality of different echo times; T2 relaxation time calculating means for calculating a T2 relaxation time based on the plurality of reference images produced by said first reference image producing means; T2-weighted image calculating means for calculating a T2-weighted image at one of said plurality of different echo times based on the T2 relaxation time calculated by said T2 relaxation time calculating means; and sensitivity distribution calculating means for calculating said sensitivity distribution based on the reference image produced by said first reference image producing means at the echo time used when said T2-weighted image calculating means calculated said T2-weighted image, and on said T2-weighted image calculated by said T2-weighted image calculating means.

According to the magnetic resonance imaging apparatus of the present invention, the first reference image producing means produces, based on magnetic resonance signals from an imaged region received by a receive coil in a predefined imaging sequence with a plurality of different echo times in a reference scan, reference images respectively at the plurality of different echo times. Then, the T2 relaxation time calculating means calculates a T2 relaxation time based on the plurality of reference images produced by the first reference image producing means. The T2-weighted image calculating means then calculates a T2-weighted image at one of the plurality of different echo times based on the T2 relaxation time calculated by the T2 relaxation time calculating means. Finally, the sensitivity distribution calculating means calculates a sensitivity distribution based on the reference image at the echo time used when the T2-weighted image calculating means calculated the T2-weighted image, and on the T2-weighted image calculated by the T2-weighted image calculating means.

To attain the aforementioned object, a magnetic resonance imaging method of the present invention is for correcting a tomographic image of an imaged region of a subject produced based on magnetic resonance signals received by a receive coil in an actual scan, with reference to a sensitivity distribution of said receive coil in said imaged region created in a reference scan, and said method comprises: a first reference image producing step of, based on said magnetic resonance signals from said imaged region received by said receive coil in a predefined imaging sequence with a plurality of different echo times in said reference scan, producing reference images respectively at said plurality of different echo times; a T2 relaxation time calculating step of calculating a T2 relaxation time based on the plurality of reference images produced by said first reference image producing step; a T2-weighted image calculating step of calculating a T2-weighted image at one of said plurality of different echo times based on the T2 relaxation time calculated by said T2 relaxation time calculating step; and a sensitivity distribution calculating step of calculating said sensitivity distribution based on the reference image produced by said first reference image producing step at the echo time used when calculating said T2-weighted image by said T2-weighted image calculating step, and on said T2-weighted image calculated by said T2-weighted image calculating step.

According to the magnetic resonance imaging method of the present invention, at the first reference image producing step, based on magnetic resonance signals from an imaged region received by a receive coil in a predefined imaging sequence with a plurality of different echo times in a reference scan, reference images are produced respectively at the plurality of different echo times. Then, at the T2 relaxation time calculating step, a T2 relaxation time is calculated based on the plurality of reference images produced by the first reference image producing step. At the T2-weighted image calculating step, a T2-weighted image at one of the plurality of different echo times is calculated based on the T2 relaxation time calculated by the T2 relaxation time calculating step. Finally, at the sensitivity distribution calculating step, a sensitivity distribution is calculated based on the reference image at the echo time used when calculating the T2-weighted image by the T2-weighted image calculating step, and on the T2-weighted image calculated by the T2-weighted image calculating step.

According to the present invention, there are provided a magnetic resonance imaging apparatus and magnetic resonance imaging method that facilitate accurate calculation of the sensitivity distribution of a receive coil, and facilitate accurate tomographic imaging on a subject.

Further objects and advantages of the present invention will be apparent from the following description of the preferred embodiments of the invention as illustrated in the accompanying drawings.

BRIEF DESCRIPTION OF THE DRAWINGS

FIG. 10 is a flow chart showing a magnetic resonance imaging method of Embodiment 4 in accordance with the present invention.

DETAILED DESCRIPTION OF THE INVENTION

Now exemplary embodiments in accordance with the present invention will be described with reference to the accompanying drawings.

Embodiment 1

The configuration of a magnetic resonance imaging apparatus of Embodiment 1 in accordance with the present invention will be described hereinbelow.

Figure 1:
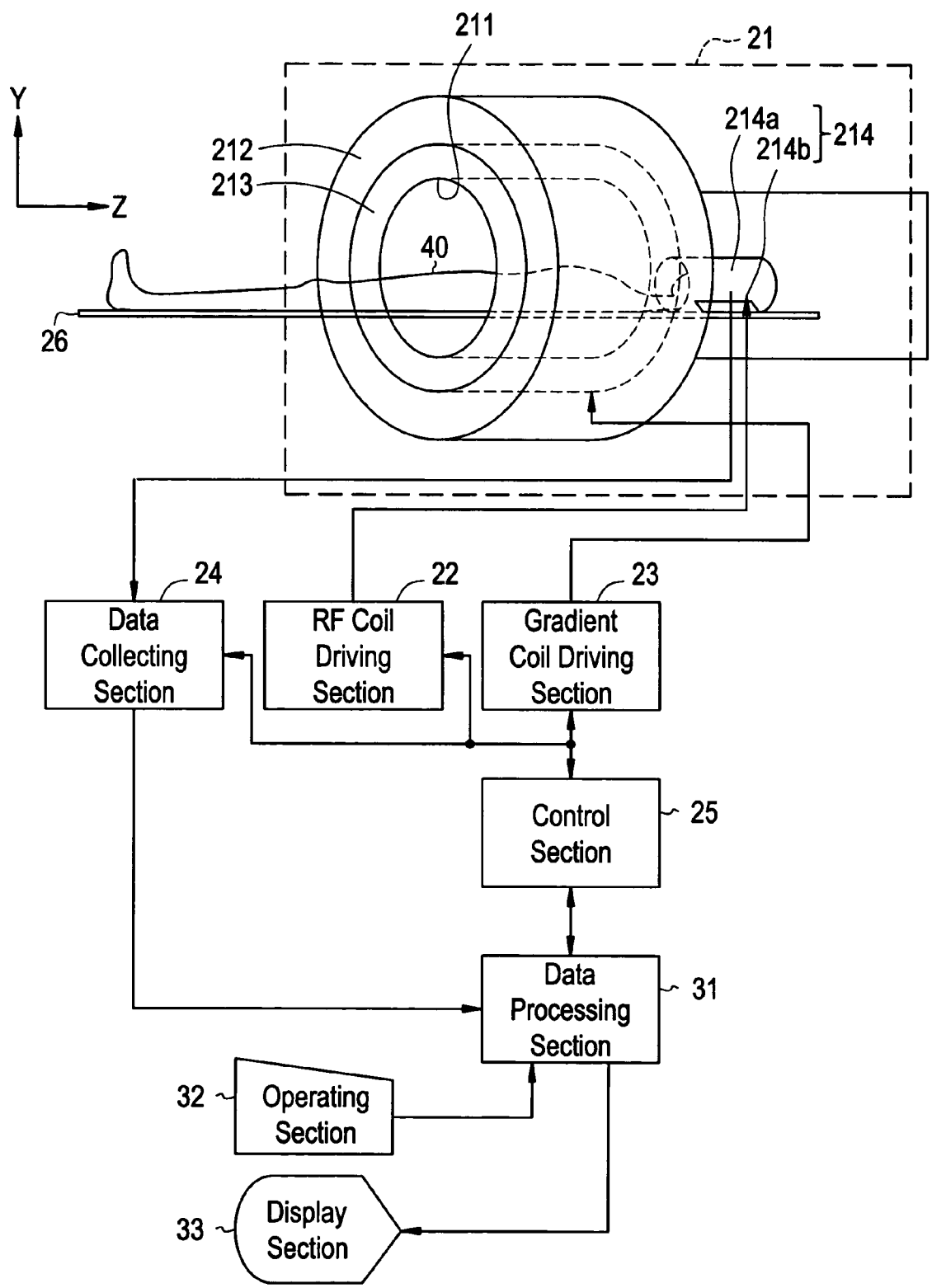
FIG. 1 is a block diagram showing the configuration of a magnetic resonance imaging apparatus of Embodiment 1 in accordance with the present invention.

FIG. 1 is a block diagram showing the configuration of a magnetic resonance imaging apparatus 1 of Embodiment 1 in accordance with the present invention.

As shown in FIG. 1, the magnetic resonance imaging apparatus 1 comprises a magnet system 21, an RF (radio frequency) driving section 22, a gradient driving section 23, a data collecting section 24, a control section 25, a cradle 26, a data processing section 31, an operating section 32, and a display section 33.

These components will be described one by one hereinbelow.

The magnet system 21 comprises a static magnetic field magnet section 212, a gradient coil section 213, and an RF coil section 214. The static magnetic field magnet section 212 and gradient coil section 213 are disposed around a cylindrical bore 211, which is an imaging space. The RF coil section 214 is provided over a head of a subject 40 rested on the cradle 26. The cradle 26 on which the subject 40 is rested is carried into the bore 211.

Although the head of the subject 40 and the RF coil section 214 are shown outside the bore 211 in FIG. 1 for clarity of illustration, the head of the subject 40 and the RF coil section 214 are positioned in the central portion of the bore 211.

The static magnetic field magnet section 212 is made from a superconductive magnet, for example, and generates a static magnetic field within the bore 211. For the static magnetic field magnet section 212, a magnetic field generating magnet such as a permanent magnet or a normal conductive magnet may be used instead of the superconductive magnet. The static magnetic field magnet section 212 is configured to have the direction of the static magnetic field aligned with the body axis direction Z of the subject 40.

The gradient coil section 213 generates gradient magnetic fields for giving gradients to the intensity of the static magnetic field generated by the static magnetic field magnet section 212 for incorporating three-dimensional positional information into magnetic resonance signals received by the RF coil section 214. The gradient magnetic fields generated by the gradient coil section 213 include three types of magnetic fields: a slice selective gradient magnetic field, a readout gradient magnetic field, and a phase encoding gradient magnetic field. To generate these gradient magnetic fields, the gradient coil section 213 comprises three gradient coils corresponding to the gradient magnetic fields.

The RF coil section 214 transmits electromagnetic waves to generate a high frequency magnetic field for exciting spins of protons in an imaged region in the subject 40 within the static magnetic field space generated by the static magnetic field magnet section 212, and receives electromagnetic waves generated by the protons excited in the imaged region in the subject 40 as magnetic resonance signals. In the present embodiment, the RF coil section 214 comprises a first RF coil 214a and a second RF coil 214b.

The first RF coil 214a is made from a volume coil, and is disposed to surround the whole head that is the imaged region in the subject 40. The second RF coil 214b is disposed to cover the neck of the subject 40 that is part of the imaged region. In the present embodiment, the first RF coil 214a is primarily used as a transmit coil, and as a receive coil when a plurality of reference images are produced by a fifth reference image producing section 261, which will be described later.

On the other hand, the second RF coil 214b is used as a receive coil. The second RF coil 214b, however, may be used in both transmission and reception, as with the first RF coil.

The RF driving section 22 comprises a gate modulator (not shown), an RF power amplifier (not shown), and an RF oscillator (not shown). The RF driving section 22 generates a driving signal based on instructions from the control section 25, and drives the gate modulator to modulate a high frequency output signal from the RF oscillator into a pulsed signal of predefined timing and predefined envelope. The RF signal modulated by the gate modulator is then amplified in power by the RF power amplifier, applied to the first RF coil 214a serving as a transmit coil, and transmitted to the imaged region in the subject 40 to excite spins in the imaged region in the subject 40.

The gradient driving section 23 supplies a driving signal to the gradient coil section 213 based on instructions from the control section 25 to generate the gradient magnetic fields in the bore 211. The gradient driving section 23 has three driving circuits, which are not shown, corresponding to the three gradient coils in the gradient coil section 213.

The data collecting section 24 comprises a preamplifier (not shown), a phase detector (not shown), and an analog-digital converter (not shown). The data collecting section 24 acquires magnetic resonance signals from the second RF coil 214b serving as a receive coil, amplifies them by the preamplifier, and outputs them to the phase detector. The magnetic resonance signals amplified by the preamplifier are then phase-detected by the phase detector with reference to the output from the RF oscillator in the RF driving section 22, and output to the analog-digital converter. The magnetic resonance signals that are analog signals phase-detected by the phase detector are converted into digital signals by the analog-digital converter, and output to the data processing section 31.

The control section 25 controls the RF driving section 22, gradient driving section 23 and data collecting section 24 according to a predefined pulse sequence based on a command signal from the operating section 32. The control section 25 also controls the data processing section 31 based on several kinds of command signals supplied to the operating section 32 for obtaining a desired image.

The cradle 26 is a table for laying thereon the subject 40, and is capable of being inserted into or removed from the bore 211, or the imaging space, by a cradle driving section (not shown).

The data processing section 31 is connected to the control section 25, and controls the control section 25 in response to an operation command supplied from the operating section 32. The data processing section 31 is also connected to the data collecting section 24, and performs several kinds of image processing on the magnetic resonance signals output from the data collecting section 24 to display an image on the display section 33.

Figure 2:
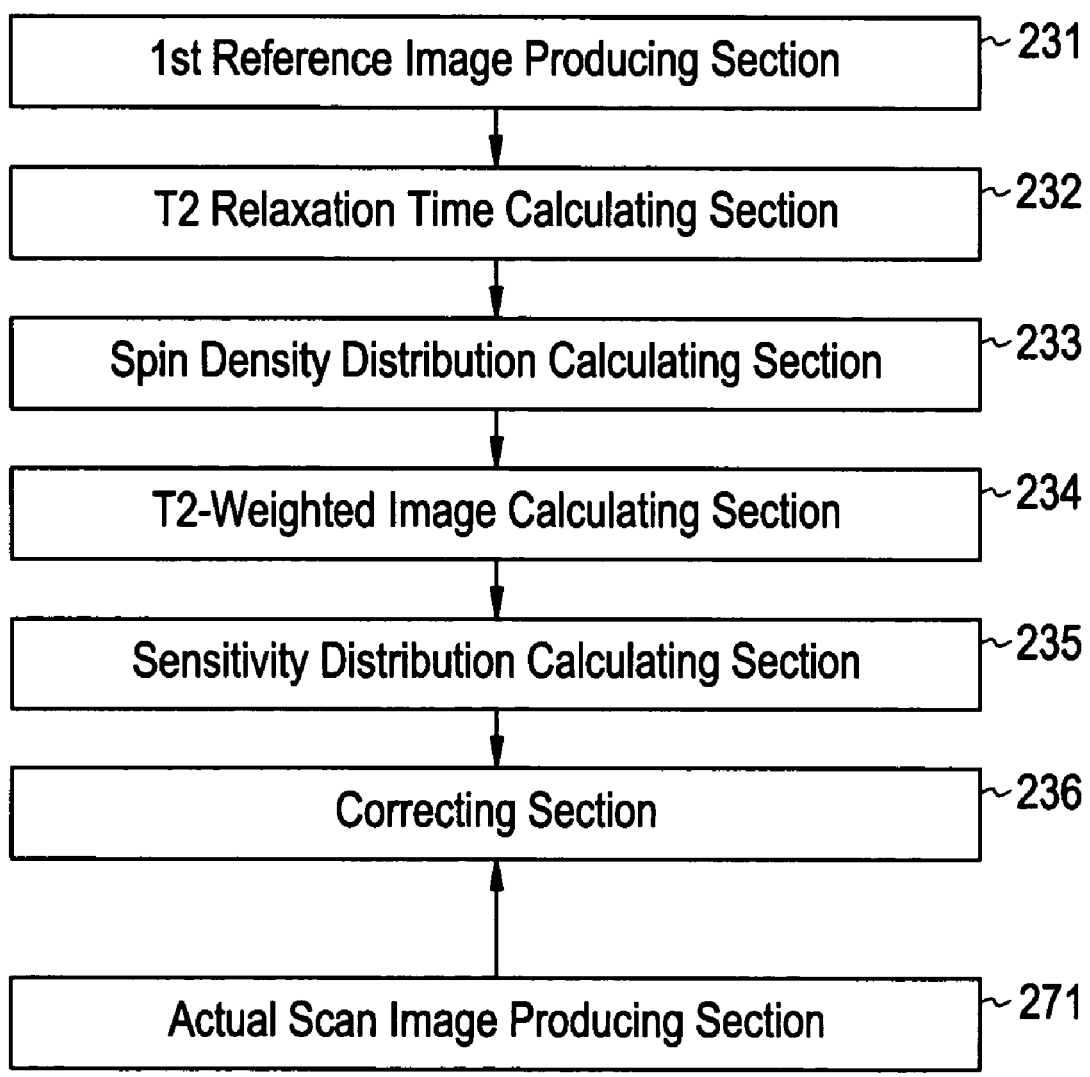
FIG. 2 is a block diagram showing components executing image processing in a data processing section in Embodiment 1 in accordance with the present invention.

FIG. 2 is a block diagram showing components executing image processing in the data processing section 31.

As shown in FIG. 2, the data processing section 31 comprises a first reference image producing section 231, a T2 relaxation time calculating section 232, a spin density distribution calculating section 233, a T2-weighted image calculating section 234, a sensitivity distribution calculating section 235, a correcting section 236, and an actual scan image producing section 271.

The first reference image producing section 231 of the present embodiment corresponds to the first reference image producing means of the present invention. The T2 relaxation time calculating section 232 of the present embodiment corresponds to the T2 relaxation time calculating means of the present invention. The spin density distribution calculating section 233 of the present embodiment corresponds to the spin density distribution calculating means of the present invention. The T2-weighted image calculating section 234 of the present embodiment corresponds to the T2-weighted image calculating means of the present invention. The sensitivity distribution calculating section 235 of the present embodiment corresponds to the sensitivity distribution calculating means of the present invention.

The first reference image producing section 231 produces, in a reference scan for creating a reception sensitivity distribution for the second RF coil 214b, which is the surface coil, a plurality of reference images based on magnetic resonance signals from the imaged region received by the second RF coil 214b at a plurality of different echo times in a predefined imaging sequence. The first reference image producing section 231 performs Fourier transformation on the magnetic resonance signals output from the data collecting section 24 as digital signals to form a k-space, and performs inverse Fourier transformation to reconstruct and produce a tomographic image of the imaged region in the subject 40. For example, the first reference image producing section 231 produces, in a reference scan according to the fast spin echo technique, a first reference image $Is_1(x, y)$ based on magnetic resonance signals received by the second RF coil 214b at a first echo time TE1, and a second reference image $Is_2(x, y)$ based on magnetic resonance signals received at a second echo time TE2 different from the first echo time TE1, both reference images corresponding to pixel positions (x, y). The first reference image $Is_1(x, y)$ and second reference image $Is_2(x, y)$ are produced by similar imaging sequences except that the first echo time TE1 and second echo time TE2 are different. By conducting the reference scan according to a pulse sequence based on the fast spin echo technique, the time taken by a reference scan is reduced. Preferably, the first reference image producing section 231 produces the plurality of reference images using magnetic resonance signals received by a T2-weighting pulse sequence so that a T2 relaxation time T2(x, y) can be calculated in the T2 relaxation time calculating section 232.

The T2 relaxation time calculating section 232 calculates a spin-spin relaxation time, i.e., T2 relaxation time, based on the plurality of reference images produced by the first reference image producing section 231. For example, the T2 relaxation time calculating section 232 calculates a T2 relaxation time T2(x, y) based on the first reference image $Is_1(x, y)$ and second reference image $Is_2(x, y)$ produced by the first reference image producing section 231.

The spin density distribution calculating section 233 calculates a spin density distribution N(x, y) based on the T2 relaxation time T2(x, y) calculated by the T2 relaxation time calculating section 232.

The T2-weighted image calculating section 234 calculates T2-weighted images at the plurality of different echo times based on the T2 relaxation time T2(x, y) calculated by the T2 relaxation time calculating section 232 and the spin density distribution N(x, y) calculated by the spin density distribution calculating section 233. For example, the T2-weighted image calculating section 234 produces a T2-weighted image $Ie_2(x, y)$ at the second echo time TE2. The T2-weighted image calculating section 234 may produce a T2-weighted image $Ie_1(x, y)$ at the first echo time TE1.

The sensitivity distribution calculating section 235 calculates a sensitivity distribution of the second RF coil 214b in the imaged region in the subject 40 based on the reference image at the echo time used when the T2-weighted image calculating section 234 calculated the T2-weighted image, and on the T2-weighted image calculated by the T2-weighted image calculating section 234. For example, the sensitivity distribution calculating section 235 calculates a sensitivity distribution H(x, y) of the second RF coil 214b based on a combination of the T2-weighted image $Ie_2(x, y)$ and the second reference image $Is_2(x, y)$ produced by the first reference image producing section 231, both at the second echo time TE2. The sensitivity distribution calculating section 235 may calculate the sensitivity distribution H(x, y) of the second RF coil 214b based on a combination of the T2-weighted image $Ie_2(x, y)$ and first reference image $Is_1(x, y)$, both at the first echo time TE1.

The correcting section 236 corrects a tomographic image Isa(x, y) by an actual scan produced by the actual scan image producing section 271 that will be described below, based on the sensitivity distribution H(x, y) calculated by the sensitivity distribution calculating section 235.

The actual scan image producing section 271 produces a tomographic image Isa(x, y) of the imaged region in the subject 40 based on magnetic resonance signals emitted and received from the imaged region in the subject 40 in an actual scan according to a predefined imaging sequence. The actual scan image producing section 271 produces the tomographic image Isa(x, y) of the imaged region in the subject 40 based on magnetic resonance signals acquired by the actual scan according to an imaging sequence based on an imaging method such as, for example, the spin echo technique or gradient echo technique. The tomographic image Isa(x, y) produced by the actual scan image producing section 271 is corrected by the correcting section 236 based on the sensitivity distribution H(x, y), as described above, and displayed on the display section 33.

The operating section 32 is comprised of operation devices such as a keyboard and a mouse, and outputs an operational signal in response to an operation by the operator to the control section 25.

The display section 33 comprises a display device such as a graphic display, and conducts display based on a tomographic image output from the data processing section 31.

Now description will be made on a magnetic resonance imaging method for capturing a tomographic image of an imaged region in the subject 40 using the magnetic resonance imaging apparatus 1 of the present embodiment.

Figure 3:
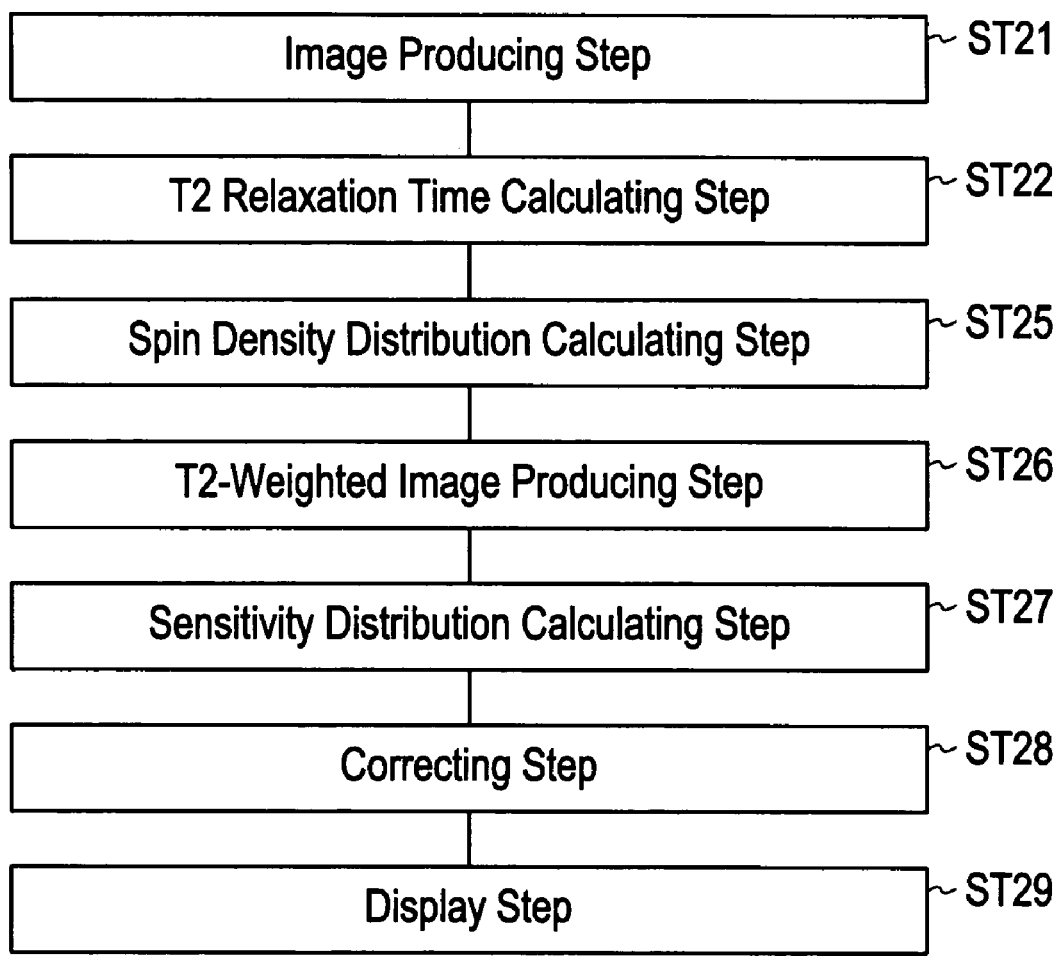
FIG. 3 is a flow chart showing a magnetic resonance imaging method of Embodiment 1 in accordance with the present invention.

FIG. 3 is a flow chart showing the magnetic resonance imaging method of the present embodiment.

As shown in FIG. 3, the magnetic resonance imaging method of the present embodiment sequentially executes an image producing step ST21, a T2 relaxation time calculating step ST22, a spin density distribution calculating step ST25, a T2-weighted image calculating step ST26, a sensitivity distribution calculating step ST27, a correction step ST28, and a display step ST29. The magnetic resonance imaging method of the present embodiment calculates a sensitivity distribution of the second RF coil 214b in the imaged region by a reference scan, for the purpose of correcting a tomographic image of the imaged region in the subject 40 produced based on magnetic resonance signals received by the second RF coil 214b in an actual scan. The sensitivity distribution of the second RF coil 214b is then used to correct the tomographic image of the imaged region in the subject 40 produced by the actual scan.

Now the steps will be described one by one hereinbelow.

Prior to the aforementioned steps, the subject 40 is first rested on the cradle 26. Thereafter, the RF coil section 214 is fitted over the head of the subject 40. The cradle 26 on which the subject 40 is laid is driven by the cradle driving section, and inserted into the bore 211 in which a static magnetic field is generated by the static magnetic field magnet section 212; the imaged region in the subject 40 is thus positioned in the central portion of the bore 211.

Then, information for imaging is input to the operating section 32 by the operator. In the present embodiment, to receive magnetic resonance signals at the second RF coil 214*b* (the surface coil) to be output to the first reference image producing section 231 at the image producing step ST21, which will be described below, a corresponding imaging sequence is specified as a reference scan by the operator.

Specifically, to receive magnetic resonance signals at the second RF coil 214*b* (the surface coil) to be output to the first reference image producing section 231, an imaging sequence with a plurality of different echo times based on the fast spin echo technique, for example, is specified as the reference scan by the operator.

Moreover, for an actual scan, to receive magnetic resonance signals at the second RF coil 214*b* (the surface coil) to be output to the actual scan image producing section 271, an imaging sequence based on the spin echo technique, for example, is specified by the operator. At that time, the operating section 32 outputs an operational signal based on the operation by the operator to the control section 25.

Then, at the image producing step ST21, the control section 25 controls the RF driving section 22, gradient driving section 23 and data collecting section 24 and drives the RF coil section 214 and gradient coil section 213 in the magnet system 21 based on the operational signal to sequentially conduct the reference scan and actual scan. The magnetic resonance signals from the subject 40 are then received by the second RF coil 214*b*, and the received magnetic resonance signals are correspondingly output to the first reference image producing section 231 and actual scan image producing section 271, which then produce respective images. The reference images are then subjected to processing for removing noise based on a prespecified threshold.

Figure 4:
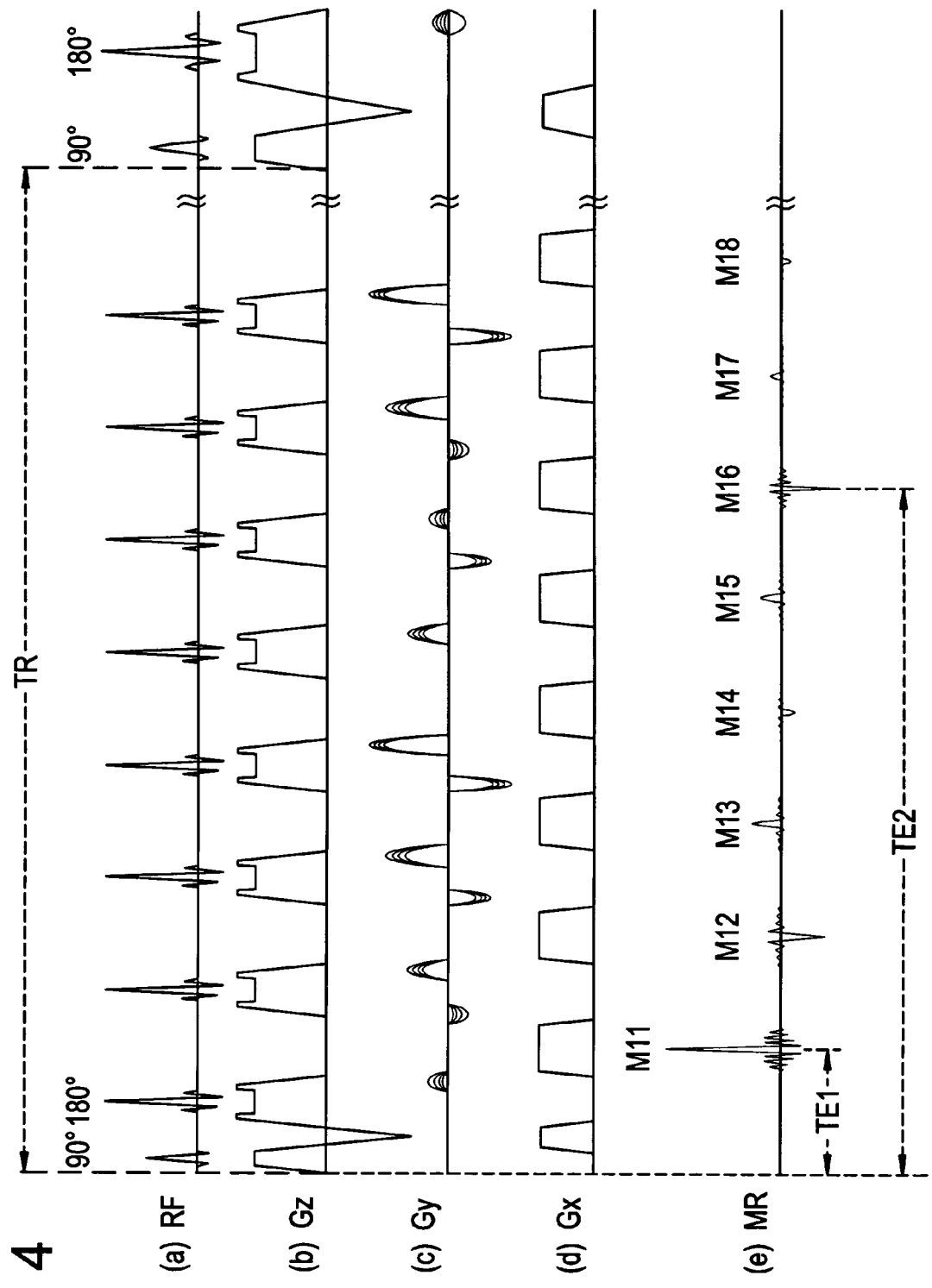
FIG. 4 is an imaging sequence chart of a reference scan in which magnetic resonance signals to be output to the first reference image producing section are received by the second RF coil, which is the surface coil, in Embodiment 1 in accordance with the present invention.

FIG. 4 is an imaging sequence chart in a reference scan in which magnetic resonance signals to be output to the first reference image producing section 231 are received by the second RF coil 214*b* (the surface coil). In FIG. 4, graph (a) shows RF pulses applied to the imaged region in the subject 40 from the first RF coil 214*a* serving as a transmit coil. Graph (b) shows the slice selective gradient magnetic field Gz generated by the gradient coil section 213, (c) shows the phase encoding gradient magnetic field Gy generated by the gradient coil section 213, and (d) shows the readout gradient magnetic field Gx generated by the gradient coil section 213. Graph (e) shows magnetic resonance signals MR received by the second RF coil 214B serving as a receive coil.

As shown in FIG. 4, in a reference scan in which magnetic resonance signals to be output to the first reference image producing section 231 are received, an imaging sequence according to the fast spin echo technique is employed. In the present embodiment, the repetition time TR is defined as 3000 msec, and the number of echoes in an echo train per cycle of repetition time is eight, for example. Moreover, in the present embodiment, a separate echo train is used, and an echo train of first four echoes is assigned to a first echo time TE, and an echo train of last four echoes is assigned to the second echo time TE2. Furthermore, the echo interval is defined as 16 msec, the effective echo time of the first echo time TE1 is defined as 16 msec, and the effective echo time of the second echo time TE2 is defined as 96 msec.

In the reference scan in which magnetic resonance signals to be output to the first reference image producing section 231 are received, as shown in FIG. 4, the RF driving section 22 first applies a driving signal to the first RF coil 214*a* in the RF coil section 214 to transmit a 90° RF pulse to the subject 40, and the gradient driving section 23 drives the gradient coil 213 to apply the slice gradient magnetic field Gz in the positive direction to the subject 40, thereby selectively exciting a prespecified slice. Thereafter, the slice gradient magnetic field Gz in the negative direction is applied to refocus the phases of spins in the slice selective direction, thereby correcting signal decay due to a phase offset.

After a predefined time from the application of the 90° RF pulse, the readout gradient magnetic field Gx in the positive direction is applied to the subject 40. At that time, a gradient magnetic field having an area half the area of the readout gradient magnetic field Gx applied at an echo time, which will be described later, is applied to dephase spins beforehand so that the spins are coordinated to rephase at the echo time, thus enabling magnetic resonance signals to be acquired at high signal intensity.

After a predefined time from the 90° RF pulse application, the RF driving section 22 applies a driving signal to the first RF coil 214*a* in the RF coil section 214 to apply a 180° RF pulse to the subject 40, and the gradient driving section 23 drives the gradient coil 213 to apply the slice gradient magnetic field Gz in the positive direction to the subject 40, thus selectively exciting the prespecified slice for spin inversion. At that time, a crusher gradient magnetic field is applied before and after the slice gradient magnetic field Gz under the 180° RF pulse application so that spins refocus accurately at the echo time.

After a predefined time from the 180° RF pulse application, the gradient driving section 23 drives the gradient coil 213 to apply the phase encoding gradient magnetic field Gy in the positive direction to the subject 40, thus phase encoding the selectively excited slice.

The gradient driving section 23 then drives the gradient coil 213 to apply the readout gradient magnetic field Gx in the positive direction to the subject 40 in conformance to a predefined sampling time, thereby frequency encoding the selectively excited slice; and a first magnetic resonance signal M11 is thus received by the second RF coil 214B serving as a receive coil.

The received magnetic resonance signal is then subjected to predefined processing by the data collecting section 24, converted into a digital signal, and subjected to Fourier transformation to form the k-space.

As described above, in the present embodiment, the number of echoes in an echo train in a repetition time TR is eight, and an echo train of first four echoes is assigned to a first echo time TE, and an echo train of last four echoes is assigned to the second echo time TE2. Thus, in the present embodiment, predefined phase encoding and frequency encoding are repeated in the repetition time TR to insert the first through fourth magnetic resonance signals M11–M14 and fifth through eighth magnetic resonance signals M15–M18 in two respective k-spaces.

If the number of phase encodings in each k-space is defined as 64, for example, the steps in the repetition time TR are repeated 16 times to fill in the k-space. The magnetic resonance signals subjected to Fourier transformation are then subjected to inverse Fourier transformation for reconstruction by the image producing section 231, whereby the first reference image $Is_1(x, y)$ at the first echo time TE1 and the second reference image $Is_2(x, y)$ at the second echo time TE2 are produced corresponding to pixel positions (x, y).

Next, at the T2 relaxation time calculating step ST22, the T2 relaxation time calculating section 232 calculates a T2 relaxation time T2(x, y) corresponding to pixel positions (x, y) based on the first reference image $Is_1(x, y)$ and second reference image $Is_2(x, y)$ produced by the first reference image producing section 231. At that time, the signal intensity I(x, y) in the T2-weighted image has a relationship as given by Equation (3) with the spin density N(x, y), sensitivity distribution H(x, y), echo time TE, and T2 relaxation time T2(x, y). Accordingly, the T2 relaxation time calculating section 232 uses the first reference image $Is_1(x, y)$ and second reference image $Is_2(x, y)$ produced at the plurality of different echo times TE1 and TE2 to calculate the T2 relaxation time T2(x, y) corresponding to pixel positions (x, y) according to Equation (4).

$$I(x, y) = N(x, y) \cdot H(x, y) \cdot \exp\{-TE/T2(x, y)\} \quad (3)$$

$$T2(x, y) = -(TE1-TE2)/\text{Log}\{Is_1(x, y)/Is_2(x, y)\} \quad (4)$$

Next, at the spin density distribution calculating step ST25, the spin density distribution calculating section 233 is used to calculate the spin density distribution N(x, y) based on the T2 relaxation time T2(x, y) calculated by the T2 relaxation time calculating section 232 on the assumption that, for example, the spin density of the cerebrospinal fluid is 1.00 in a static magnetic field having intensity of 1.5 Teslas. For example, if T2(x, y)=50—less than 80 ms, the tissue at that pixel position (x, y) is determined to be white matter and a value of 0.61 is defined, which is the value of the spin density of white matter found in the literature. If T2(x, y)=80—less than 200 ms, for example, the tissue at that pixel position (x, y) is determined to be gray matter and a value of 0.69 is defined, which is the value of the spin density of gray matter found in the literature. If T2(x, y)=200 ms or more, for example, the tissue at that pixel position (x, y) is determined to be cerebrospinal fluid and a value of 1.00 is defined, which is the value of the spin density of cerebrospinal fluid found in the literature.

Next, at the T2-weighted image calculating step ST26, the T2-weighted image calculating section 233 is used to produce a T2-weighted image $Ie_2(x, y)$ at the second echo time TE2, as given by Equation (5), based on the T2 relaxation time T2(x, y) calculated by the T2 relaxation time calculating section 232 and the spin density distribution N(x, y) calculated by the spin density distribution calculating section 233. It should be noted that a T2-weighted image $Ie_1(x, y)$ at the first echo time TE1 instead of the second echo time TE2 may be produced. As can be seen from Equation (5), the T2-weighted image is independent of the sensitivity distribution H(x, y).

$$Ie_2(x, y) = N(x, y) \cdot \exp\{-TE2/T2(x, y)\} \quad (5)$$

Next, at the sensitivity distribution calculating step ST27, the sensitivity distribution calculating section 235 is used to calculate a sensitivity distribution H(x, y) of the second RF coil 214b (the surface coil) according to Equation (6), based on a combination of the T2-weighted image $Ie_2(x, y)$ and second reference image $Is_2(x, y)$ at the second echo time TE2. Thereafter, the sensitivity distribution H(x, y) is subjected to extrapolation or interpolation, and low-pass filtering in which lower frequency components are passed.

$$H(x, y) = Is_2(x, y)/Ie_2(x, y) \quad (6)$$

If the T2-weighted image $Ie_1(x, y)$ at the first echo time TE1 is produced at the previous T2-weighted image calculating step ST26 instead of the that at the second echo time TE2, the sensitivity distribution H(x, y) is similarly calculated based on a combination with the T2-weighted image $Ie_1(x, y)$ at the first echo time TE1.

Next, at the correction step ST28, the tomographic image Isa(x, y) produced by the actual scan is corrected by the correcting section 236 based on the sensitivity distribution H(x, y) calculated by the sensitivity distribution calculating section 235. The correcting section 236 corrects the tomographic image Isa(x, y) produced by the actual scan according to Equation (7) below, and outputs the corrected tomographic image Isa'(x, y) to the display section 33.

$$Isa'(x, y) = Isa(x, y)/H(x, y) \quad (7)$$

Next, at the display step ST29, a tomographic image of the subject 40 is displayed on the display section 33 based on the corrected tomographic image Isa'(x, y). In this way, the magnetic resonance imaging method of the present embodiment calculates the sensitivity distribution of the second RF coil 214B serving as a receive coil by a reference scan, and uses the calculated sensitivity distribution to correct non-uniformity of a tomographic image by an actual scan for display.

As described above, according to the present embodiment, based on magnetic resonance signals from an imaged region received by the second RF coil 214b (the surface coil) in a predefined imaging sequence with a plurality of different echo times TE1 and TE2 in a reference scan, the first reference image producing section 231 produces reference images $Is_1(x, y)$ and $Is_2(x, y)$ that are T2-weighted images of the imaged region at the plurality of different echo times TE1 and TE2. The T2 relaxation time calculating section 232 then calculates a T2 relaxation time T2(x, y) based on the plurality of reference images $Is_1(x, y)$ and $Is_2(x, y)$ produced by the first reference image producing section 231. The T2-weighted image calculating section 234 then calculates a T2-weighted image $Ie_2(x, y)$ at the echo time TE2 based on the T2 relaxation time T2(x, y) calculated by the T2 relaxation time calculating section 232. The sensitivity distribution calculating section 235 then calculates a sensitivity distribution H(x, y) based on the reference image $Is_2(x, y)$ at the echo time TE2 used when the T2-weighted image calculating section 234 calculated the T2-weighted image $Ie_2(x, y)$, and on the T2-weighted image $Ie_2(x, y)$ calculated by the T2-weighted image calculating section 234, both images at the echo time TE2. A tomographic image Isa(x, y) by an actual scan is then corrected based on the sensitivity distribution H(x, y) calculated by the sensitivity distribution calculating section 235. The corrected tomographic image Isa'(x, y) is then output to the display section 33 for display. That is, in the present embodiment, a plurality of reference images $Is_1(x, y)$ and $Is_2(X, y)$ at a plurality of different echo times TE1 and TE2 are used to calculate the T2 relaxation time T2(x, y), then the T2-weighted image $Ie_2(x, y)$ in which sensitivity plays no part is calculated, and based on the T2-weighted image $Ie_2(x, y)$, the sensitivity distribution H(x, y) of the second RF coil 214b (the surface coil) in the imaged region is created. Thus, according to the present embodiment, unlike in the conventional techniques, there is no need to use a receive coil having a uniform sensitivity distribution, such as a volume coil, in addition to a receive coil whose sensitivity distribution is to be calculated, and therefore, an accurate sensitivity distribution is easily calculated, thereby facilitating accurate tomographic imaging on a subject.

Moreover, in the present embodiment, the spin density distribution N(x, y) is calculated by the spin density distribution calculating section 233 based on the T2 relaxation time T2(x, y) calculated by the T2 relaxation time calculating section 232. The T2-weighted image calculating section 234 then calculates the T2-weighted image $Ie_2(x, y)$ based on the T2 relaxation time T2(x, y) calculated by the T2 relaxation time calculating section 232, and on the spin density distribution N(x, y) calculated by the spin density distribution calculating section 233. Since in the present embodiment, the sensitivity distribution H(x, y) is calculated based on the spin density distribution N(x, y) in addition to the T2 relaxation time T2(x, y), an accurate sensitivity distribution H(x, y) is easily calculated, thereby facilitating accurate tomographic imaging on a subject.

Embodiment 2

The configuration of a magnetic resonance imaging apparatus of Embodiment 2 in accordance with the present invention will be described hereinbelow.

Figure 5:
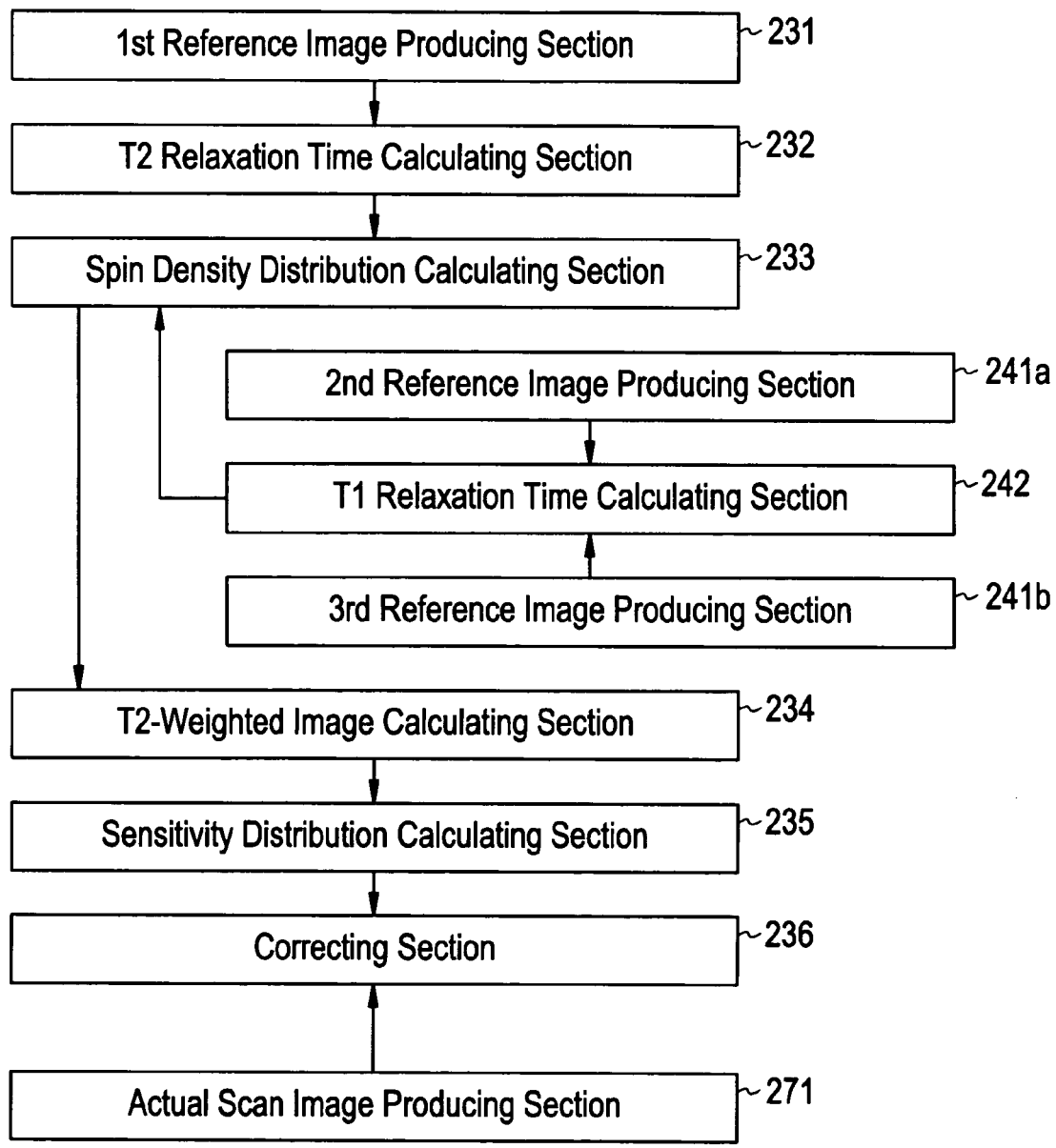
FIG. 5 is a block diagram showing components executing image processing in a data processing section in Embodiment 2 in accordance with the present invention.

FIG. 5 is a block diagram showing components executing image processing in the data processing section 31 in Embodiment 2.

As shown in FIG. 5, the data processing section 31 of Embodiment 2 comprises the first reference image producing section 231, T2 relaxation time calculating section 232, spin density distribution calculating section 233, T2-weighted image calculating section 234, sensitivity distribution calculating section 235, correcting section 236, a second reference image producing section 241a, a third reference image producing section 241b, a T1 relaxation time calculating section 242, and the actual scan image producing section 271.

The magnetic resonance imaging apparatus of Embodiment 2 is similar to that of Embodiment 1 except that it has the second reference image producing section 241a, third reference image producing section 241b and T1 relaxation time calculating section 242. Therefore, explanation of redundant portions will be omitted.

The second reference image producing section 241a of the present embodiment corresponds to the second reference image producing means of the present invention. The third reference image producing section 241b of the present embodiment corresponds to the third reference image producing means of the present invention. The T1 relaxation time calculating section 242 of the present embodiment corresponds to the T1 relaxation time calculating means of the present invention.

These components will be described one by one hereinbelow.

The second reference image producing section 241a produces a plurality of reference images based on magnetic resonance signals from the imaged region received by the second RF coil 214b in an imaging sequence with a plurality of different repetition times according to the saturation recovery method in a reference scan. For example, the second reference image producing section 241a defines a repetition time TR in the reference scan according to the spin echo technique so that longitudinal magnetization vectors of spins are completely recovered, and produces a third reference image $Is_3(x, y)$ based on magnetic resonance signals received by the second RF coil 214b in a first repetition time TR1, and a fourth reference image $Is_4(x, y)$ based on magnetic resonance signals received in a second repetition time TR2 different from the first repetition time TR1, both images corresponding to pixel positions (x, y). The third reference image $Is_3(x, y)$ and fourth reference image $Is_4(x, y)$ are produced by similar imaging sequences except that the first repetition time TR1 and second repetition time TR2 are different.

The third reference image producing section 241b produces a plurality of reference images based on magnetic resonance signals from the imaged region received by the second RF coil 214b in a plurality of different inversion times in an imaging sequence according to the inversion recovery method in a reference scan. The third reference image producing section 241b first applies a 180° inversion pulse to the subject 40 in the reference scan to invert spins, and after an inversion time TI for spin recovery, conducts a scan based on a pulse sequence according to the spin echo technique, for example. At that time, the third reference image producing section 241a produces a fifth reference image $Is_5(x, y)$ based on magnetic resonance signals received by the second RF coil 214b in, for example, a first inversion time TI1, and a sixth reference image $Is_6(x, y)$ based on magnetic resonance signals received in a second inversion time TI2 different from the first inversion time TI1. The fifth reference image $Is_5(x, y)$ and sixth reference image $Is_6(x, y)$ are produced by similar imaging sequences except that the first inversion time TI1 and second inversion time TI2 are different. Preferably, the second reference image producing section 241a and third reference image producing section 241b produce the plurality of reference images using magnetic resonance signals received by a T1-weighting pulse sequence so that the T1 relaxation time calculating section 242 can calculate a T1 relaxation time T1(x, y).

The T1 relaxation time calculating section 242 calculates a spin-lattice relaxation time, i.e., T1 relaxation time T1(x, y), based on the plurality of reference images produced by the second reference image producing section 241a. For example, the T1 relaxation time calculating section 242 calculates the T1 relaxation time T1(x, y) based on the third reference image $Is_3(x, y)$ and fourth reference image $Is_4(x, y)$ produced by the second reference image producing section 241a. Moreover, the T1 relaxation time calculating section 242 also calculates the T1 relaxation time T1(x, y) based on the plurality of reference images produced by the third reference image producing section 241b. For example, the T1 relaxation time calculating section 242 calculates the T1 relaxation time T1(x, y) based on the fifth reference image $Is_5(x, y)$ and sixth reference image $Is_6(x, y)$ produced by the third reference image producing section 241b.

Unlike in Embodiment 1, the spin density distribution calculating section 233 calculates a spin density distribution N(x, y) based on a combination of the T2 relaxation time T2(x, y) calculated by the T2 relaxation time calculating section 232, along with the T1 relaxation time T1(x, y) calculated by the T1 relaxation time calculating section 242.

Now description will be made on a magnetic resonance imaging method for capturing a tomographic image of the imaged region in the subject 40 using the magnetic resonance imaging apparatus 1 of the present embodiment.

Figure 6:
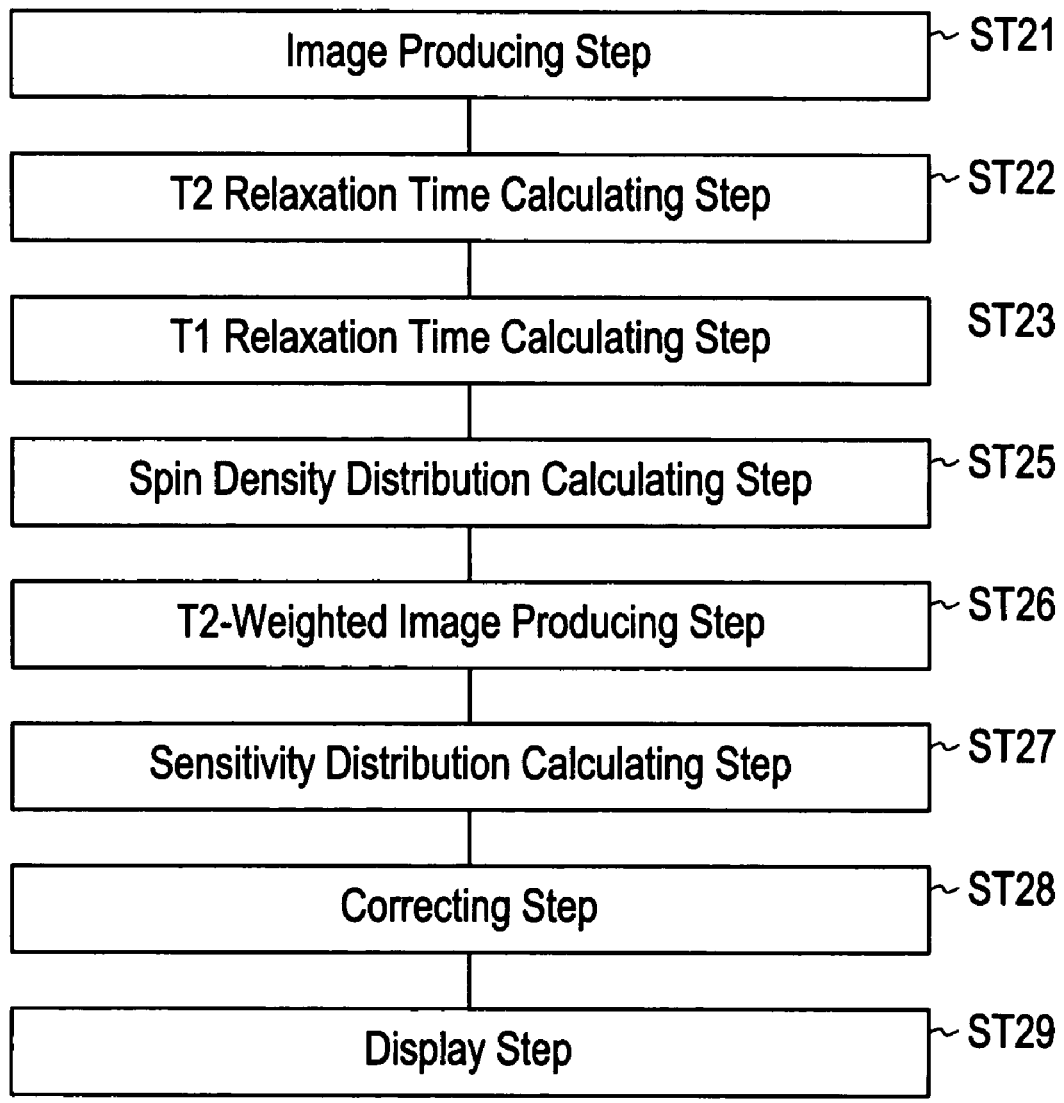
FIG. 6 is a flow chart showing a magnetic resonance imaging method of Embodiment 2 in accordance with the present invention.

FIG. 6 is a flow chart showing the magnetic resonance imaging method of the present embodiment.

As shown in FIG. 6, the magnetic resonance imaging method of the present embodiment sequentially executes the image producing step ST21, T2 relaxation time calculating step ST22, a T1 relaxation time calculating step ST23, the spin density distribution calculating step ST25, T2-weighted image calculating step ST26, sensitivity distribution calculating step ST27, correction step ST28, and display step ST29. The magnetic resonance imaging method of the present embodiment corresponds to that of Embodiment 1 added with the T1 relaxation time calculating step ST23.

Now the steps will be described one by one hereinbelow.

Similarly to in Embodiment 1, prior to the aforementioned steps, the subject 40 is first rested on the cradle 26. Thereafter, the RF coil section 214 is fitted over the head of the subject 40. The cradle 26 on which the subject 40 is laid is driven by the cradle driving section, and inserted into the bore 211 in which a static magnetic field is generated by the static magnetic field magnet section 212; the imaged region in the subject 40 is thus positioned in the central portion of the bore 211.

Then, information for imaging is input to the operating section 32 by the operator. In the present embodiment, to receive magnetic resonance signals at the second RF coil 214b (the surface coil) to be output to the first reference image producing section 231 and second reference image producing section 241a at the image producing step ST21, which will be described below, corresponding imaging sequences are specified as a reference scan by the operator.

Specifically, to receive magnetic resonance signals at the second RF coil 214b (the surface coil) to be output to the first reference image producing section 231, an imaging sequence with a plurality of different echo times based on the fast spin echo technique, for example, is specified as the reference scan by the operator. Moreover, to receive magnetic resonance signals at the second RF coil 214b (the surface coil) to be output to the second reference image producing section 241a, an imaging sequence with a plurality of different repetition times according to the saturation recovery method based on the spin echo technique, for example, is specified as the reference scan by the operator.

Instead of the imaging sequence for receiving magnetic resonance signals to be directed to the second reference image producing section 241a, an imaging sequence with a plurality of different inversion times according to the inversion recovery method based on the spin echo technique, for example, may be specified as the reference scan to receive magnetic resonance signals at the second RF coil 214b (the surface coil) to be output to the third reference image producing section 241b.

Moreover, for an actual scan, to receive magnetic resonance signals at the second RF coil 214b (the surface coil) to be output to the actual scan image producing section 271, an imaging sequence based on the spin echo technique, for example, is specified by the operator. At that time, the operating section 32 outputs an operational signal based on the operation by the operator to the control section 25.

Then, at the image producing step ST21, as in Embodiment 1, the control section 25 controls the RF driving section 22, gradient driving section 23 and data collecting section 24 and drives the RF coil section 214 and gradient coil section 213 in the magnet system 21 based on the operational signal to sequentially conduct the reference scan and actual scan. The magnetic resonance signals from the subject 40 are then received by the second RF coil 214b, and the received magnetic resonance signals are correspondingly output to the first reference image producing section 231, second reference image producing section 241a and actual scan image producing section 271, which then produce respective images. The reference images are then subjected to processing for removing noise based on a prespecified threshold.

First, at the image producing step ST21, as in Embodiment 1, the first reference image $Is_1(x, y)$ at the first echo time TE1 and the second reference image $Is_2(x, y)$ at the second echo time TE2 are produced corresponding to pixel positions (x, y).

Moreover, at the image producing step ST21, the imaging sequence according to the saturation recovery method with a plurality of repetition times, i.e., the first repetition time TR1 and the second repetition time TR2 different from the first repetition time TR1, is executed in the reference scan, and magnetic resonance signals received at the second RF coil 214b (the surface coil) are output to the second reference image producing section 241a. The second reference image producing section 241a is then used to produce the third reference image $Is_3(x, y)$ corresponding to pixel positions (x, y) based on magnetic resonance signals received in the first repetition time TR1, and the fourth reference image $Is_4(x, y)$ corresponding to pixel positions (x, y) based on magnetic resonance signals received in the second repetition time TR2.

At the image producing step ST21, as previously discussed, an imaging sequence for receiving magnetic resonance signals to be directed to the third reference image producing section 241b may be executed in place of the imaging sequence for receiving magnetic resonance signals to be directed to the second reference image producing section 241a. In this case, the control section 25 may execute an imaging sequence according to the inversion recovery method with a plurality of inversion times, i.e., for example, the first inversion time TI1 and the second inversion time TI1 different from the first inversion time TI1, in the reference scan, and magnetic resonance signals received at the second RF coil 214b (the surface coil) may be output to the third reference image producing section 241a. In this case, the third reference image producing section 241 is used to produce the fifth reference image $Is_5(x, y)$ corresponding to pixel positions (x, y) based on magnetic resonance signals received in the first inversion time TI1, and the sixth reference image $Is_6(x, y)$ corresponding to pixel positions (x, y) based on magnetic resonance signals received in the second inversion time TI2.

Next, at the T2 relaxation time calculating step ST22, as in Embodiment 1, the T2 relaxation time calculating section 232 calculates the T2 relaxation time T2(x, y) corresponding to pixel positions (x, y) based on the first reference image $Is_1(x, y)$ and second reference image $Is_2(x, y)$ produced by the first reference image producing section 231.

Next, at the T1 relaxation time calculating step ST23, the third reference image $Is_3(x, y)$ and fourth reference image $Is_4(x, y)$ produced by the second reference image producing section 241a are subjected to fitting corresponding to the repetition times TR1 and TR2 by the T1 relaxation time calculating section 242 to calculate the T1 relaxation time T1(x, y) corresponding to pixel positions (x, y). When the T1 relaxation time is calculated based on the fifth reference image $Is_5(x, y)$ and sixth reference image $Is_6(x, y)$ produced by the third reference image producing section 241b, in place of the third reference image $Is_3(x, y)$ and fourth reference image $Is_4(x, y)$ produced by the second reference image producing section 241a, fitting corresponding to the inversion times TI1 and TI2 is executed to calculate the T1 relaxation time T1(x, y) corresponding to pixel positions (x, y).

Next, at the spin density distribution calculating step ST25, the spin density distribution calculating section 233 is used to calculate a spin density distribution N(x, y) based on a combination of the T2 relaxation time T2(x, y) calculated by the T2 relaxation time calculating section 232 and the T1 relaxation time T1(x, y) calculated by the T1 relaxation time calculating section 242 on the assumption that, for example, the spin density of the cerebrospinal fluid is 1.00 in a static magnetic field having intensity of 1.5 Teslas. For example, if T1(x, y):T2(x, y) falls within (450—less than 550 ms): (50—less than 80 ms), the tissue at that pixel position (x, y) is determined to be white matter and a value of 0.61 is defined, which is the value of the spin density of white matter found in the literature. If T1(x, y):T2(x, y) falls within (550—less than 2000 ms):(80—less than 200 ms), for example, the tissue at that pixel position (x, y) is determined to be gray matter and a value of 0.69 is defined, which is the value of the spin density of gray matter found in the literature. If T1(x, y):T2(x, y) falls within (2000 ms or more):(200 ms or more), for example, the tissue at that pixel position (x, y) is determined to be cerebrospinal fluid and a value of 1.00 is defined, which is the value of the spin density of cerebrospinal fluid found in the literature.

Next, at the T2-weighted image calculating step ST26, as in Embodiment 1, the T2-weighted image calculating section 233 is used to produce a T2-weighted image $Ie_2(x, y)$ at the second echo time TE2 based on the T2 relaxation time T2(x, y) calculated by the T2 relaxation time calculating section 232 and the spin density distribution N(x, y) calculated by the spin density distribution calculating section 233.

Next, at the sensitivity distribution calculating step ST27, as in Embodiment 1, the sensitivity distribution calculating section 235 is used to calculate a sensitivity distribution H(x, y) of the second RF coil 214b (the surface coil) based on a combination of the T2-weighted image $Ie_2(x, y)$ and second reference image $Is_2(x, y)$ at the second echo time TE2. Thereafter, the sensitivity distribution H(x, y) is subjected to extrapolation or interpolation, and low-pass filtering in which lower frequency components are passed.

Next, at the correction step ST28, as in Embodiment 1, the tomographic image Isa(x, y) produced by the actual scan is corrected by the correcting section 236 based on the sensitivity distribution H(x, y) calculated by the sensitivity distribution calculating section 235. The correcting section 236 corrects the tomographic image Isa(x, y) produced by the actual scan, and outputs the corrected tomographic image Isa'(x, y) to the display section 33.

Next, at the display step ST29, as in Embodiment 1, a tomographic image of the subject 40 is displayed on the display section 33 based on the corrected tomographic image Isa'(x, y). In this way, the magnetic resonance imaging method of the present embodiment calculates the sensitivity distribution of the second RF coil 214B serving as a receive coil by a reference scan, and uses the calculated sensitivity distribution to correct non-uniformity of a tomographic image by an actual scan for display.

As described above, according to the present embodiment, based on magnetic resonance signals from an imaged region received by the second RF coil 214b in an imaging sequence with a plurality of different repetition times TR1 and TR2 according to the saturation recovery method in a reference scan, the second reference image producing section 241a produces reference images $Is_3(X, y)$ and $Is_4(x, y)$ that are T1-weighted images in the plurality of different repetition times TR1 and TR2. The T1 relaxation time calculating section 242 then calculates the T1 relaxation time T1(x, y) based on a plurality of reference images $Is_3(x, y)$ and $Is_4(x, y)$ produced by the second reference image producing section 241a. The spin density distribution calculating section 233 then calculates the spin density distribution N(x, y) based on the T2 relaxation time T2(x, y) calculated by the T2 relaxation time calculating section 232 along with the T1 relaxation time T1(x, y) calculated by the T1 relaxation time calculating section 242. According to the present embodiment, since the spin density distribution N(x, y) is calculated based on the T1 relaxation time T1(x, y) in addition to the T2 relaxation time T2(x, y), an accurate spin density distribution N(x, y) can be calculated, and therefore, an accurate sensitivity distribution H(x, y) is easily calculated, thereby facilitating accurate tomographic imaging on the subject. It should be noted that a similar effect can be obtained when the third reference image producing section 241 produces, based on magnetic resonance signals from the imaged region received by the second RF coil 214b in an imaging sequence with a plurality of different inversion times according to the inversion recovery method in the reference scan, reference images $Is_5(x, y)$ and $Is_6(x, y)$ in the plurality of different inversion times to calculate the T1 relaxation time T1(x, y) in a similar way, and then the spin density distribution N(x, y) is calculated.

Embodiment 3

The configuration of a magnetic resonance imaging apparatus of Embodiment 3 in accordance with the present invention will be described hereinbelow.

Figure 7:
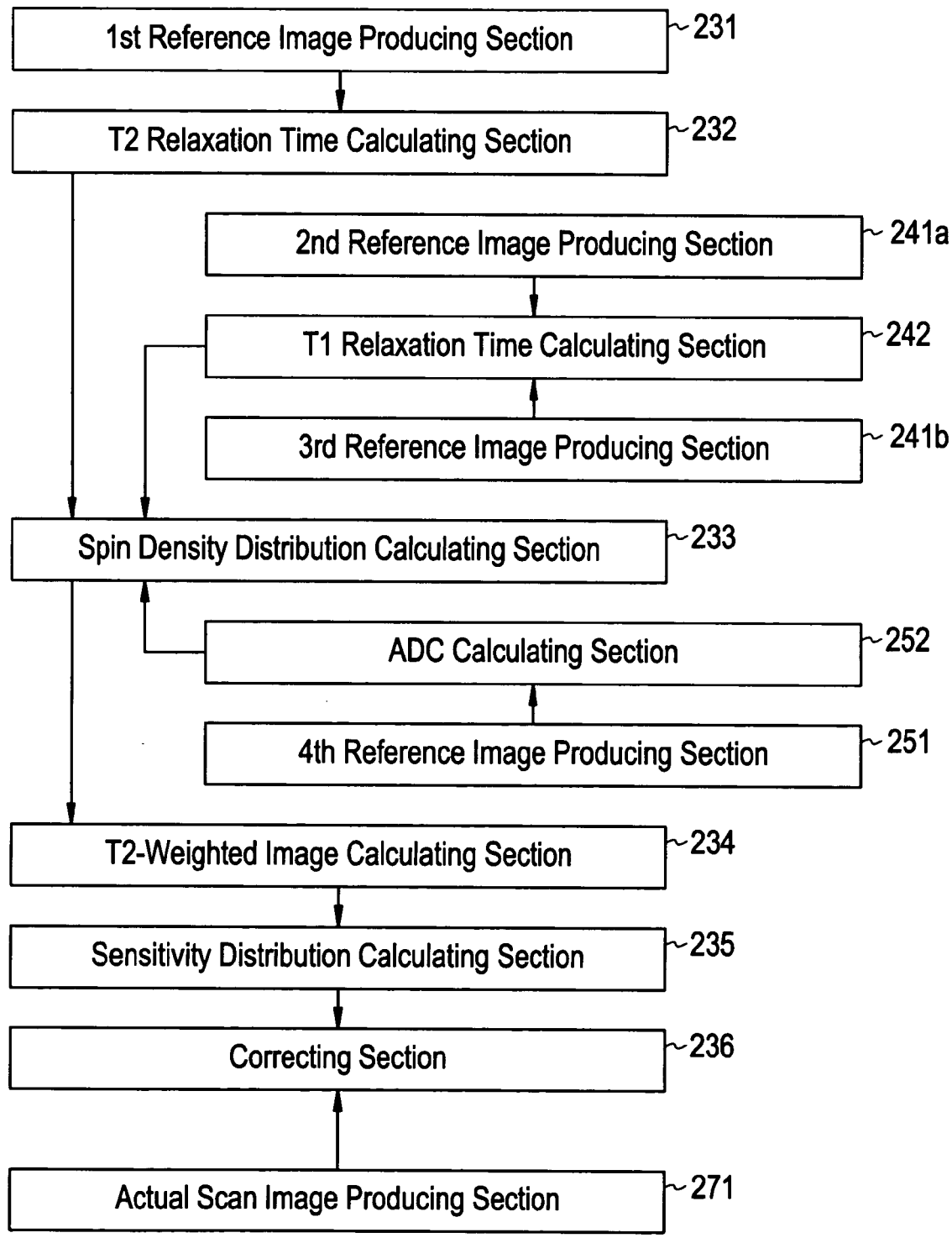
FIG. 7 is a block diagram showing components executing image processing in a data processing section in Embodiment 3 in accordance with the present invention.

FIG. 7 is a block diagram showing components executing image processing in the data processing section 31 in Embodiment 3.

As shown in FIG. 7, the data processing section 31 comprises the first reference image producing section 231, T2 relaxation time calculating section 232, spin density distribution calculating section 233, T2-weighted image calculating section 234, sensitivity distribution calculating section 235, correcting section 236, second reference image producing section 241a, third reference image producing section 241b, T1 relaxation time calculating section 242, a fourth reference image producing section 251, an apparent diffusion coefficient (ADC) calculating section 252, and the actual scan image producing section 271.

The magnetic resonance imaging apparatus of Embodiment 3 is similar to that of Embodiment 2 except that it has the fourth reference image producing section 251 and apparent diffusion coefficient calculating section 252. Therefore, explanation of redundant portions will be omitted.

The fourth reference image producing section 251 of the present embodiment corresponds to the fourth reference image producing means of the present invention. The apparent diffusion coefficient calculating section 252 of the present embodiment corresponds to the apparent diffusion coefficient calculating means of the present invention.

These components will be described one by one hereinbelow.

The fourth reference image producing section 251 produces a plurality of reference images based on magnetic resonance signals from the imaged region received by the second RF coil 214b in a predefined imaging sequence with diffusion-weighting gradient magnetic fields having a plurality of different b values in a reference scan. The fourth reference image producing section 251 achieves diffusion weighting by adding a gradient magnetic field having a b value such that diffused protons are dephased before and after a 180° pulse in a pulse sequence according to spin echo EPI (echo planar imaging), for example, in the reference scan. The fourth reference image producing section 251 produces, for example, a seventh reference image $Is_7(x, y)$ based on magnetic resonance signals received by the second RF coil 214b in a gradient magnetic field b1 having a first b value, and an eighth reference image $Is_8(x, y)$ based on magnetic resonance signals received in a gradient magnetic field b2 having a second b value different from the first b value. The seventh reference image $Is_7(x, y)$ and eighth reference image $Is_8(x, y)$ are produced by similar imaging sequences except that the first b value b1 and second b value b2 are different. Preferably, the fourth reference image producing section 251 produces the plurality of reference images using magnetic resonance signals by a diffusion-weighting pulse sequence so that the apparent diffusion coefficient calculating section 252 can calculate an apparent diffusion coefficient $D(x, y)$.

The apparent diffusion coefficient calculating section 252 calculates an apparent diffusion coefficient based on the plurality of reference images produced by the fourth reference image producing section 251. For example, the apparent diffusion coefficient calculating section 252 calculates an apparent diffusion coefficient $D(x, y)$ based on the seventh reference image $Is_7(x, y)$ and eighth reference image $Is_8(x, y)$ produced by the fourth reference image producing section 251.

Unlike in Embodiment 2, the spin density distribution calculating section 233 calculates a spin density distribution $N(x, y)$ based on a combination of the T2 relaxation time $T2(x, y)$ calculated by the T2 relaxation time calculating section 232, the T1 relaxation time $T1(x, y)$ calculated by the T1 relaxation time calculating section 242, and, in addition, the apparent diffusion coefficient $D(x, y)$ calculated by the apparent diffusion coefficient calculating section 252, which will be described below.

Figure 8:
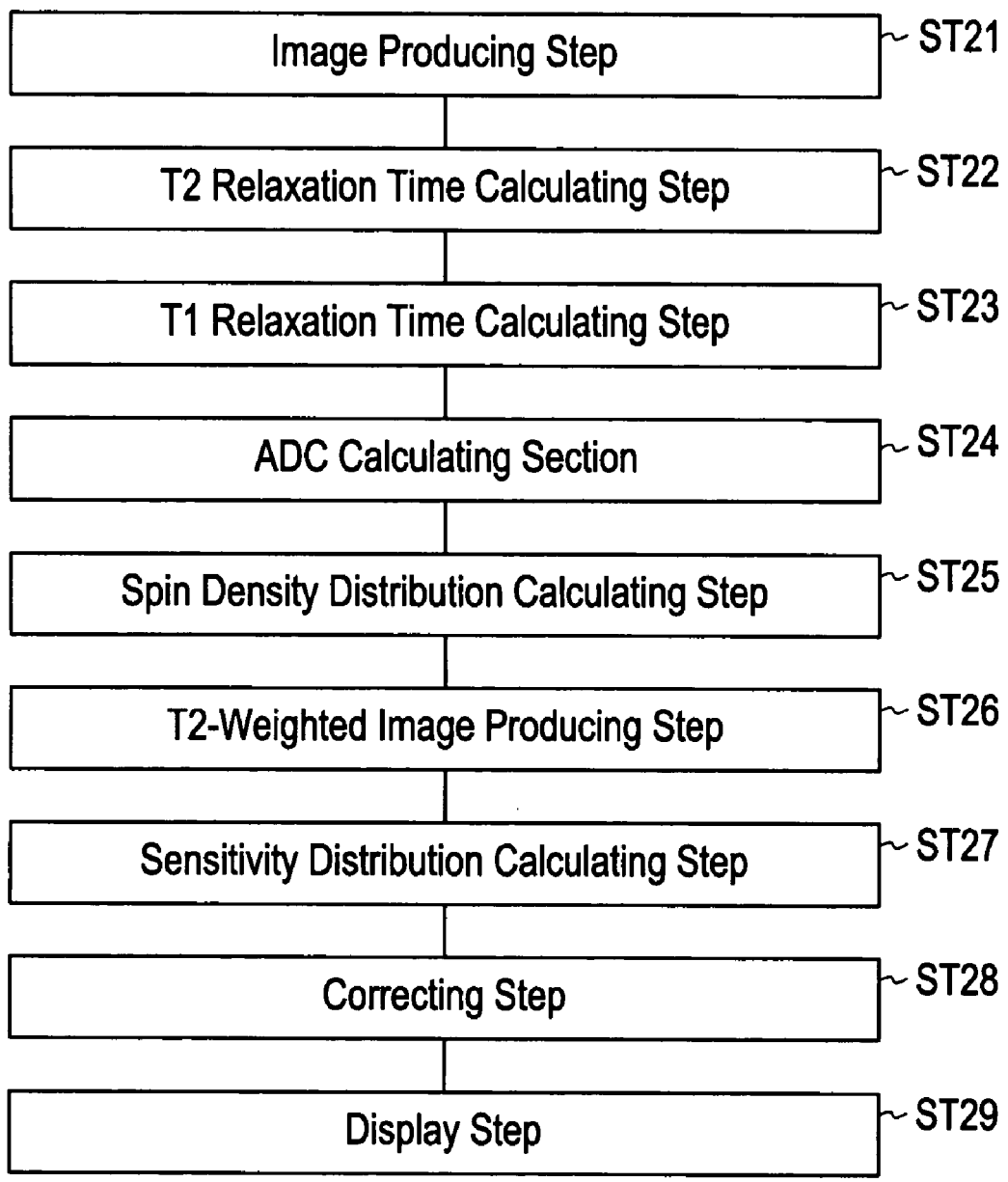
FIG. 8 is a flow chart showing a magnetic resonance imaging method of Embodiment 3 in accordance with the present invention.

FIG. 8 is a flow chart showing the magnetic resonance imaging method of the present embodiment.

As shown in FIG. 8, the magnetic resonance imaging method of the present embodiment sequentially executes the image producing step ST21, T2 relaxation time calculating step ST22, T1 relaxation time calculating step ST23, an apparent diffusion coefficient calculating step ST24, the spin density distribution calculating step ST25, T2-weighted image calculating step ST26, sensitivity distribution calculating step ST27, correction step ST28, and display step ST29. The magnetic resonance imaging method of the present embodiment corresponds to that of Embodiment 2 added with the T1 relaxation time calculating step ST23.

Now the steps will be described one by one hereinbelow.

Similarly to in Embodiment 2, prior to the aforementioned steps, the subject 40 is first rested on the cradle 26. Thereafter, the RF coil section 214 is fitted over the head of the subject 40. The cradle 26 on which the subject 40 is laid is driven by the cradle driving section, and inserted into the bore 211 in which a static magnetic field is generated by the static magnetic field magnet section 212; the imaged region in the subject 40 is thus positioned in the central portion of the bore 211.

Then, information for imaging is input to the operating section 32 by the operator. In the present embodiment, to receive magnetic resonance signals at the second RF coil 214b (the surface coil) to be output to the first reference image producing section 231, second reference image producing section 241a and fourth reference image producing section 251 at the image producing step ST21, which will be described below, corresponding imaging sequences are specified as a reference scan by the operator.

Specifically, to receive magnetic resonance signals by the second RF coil 214b (the surface coil) to be output to the first reference image producing section 231, an imaging sequence with a plurality of different echo times based on the fast spin echo technique, for example, is specified as a reference scan by the operator. Moreover, to receive magnetic resonance signals at the second RF coil 214b (the surface coil) to be output to the second reference image producing section 241a, an imaging sequence with a plurality of different repetition times according to the saturation recovery method based on the spin echo technique, for example, is specified as the reference scan by the operator. Furthermore, to receive magnetic resonance signals at the second RF coil 214b (the surface coil) to be output to the fourth reference image producing section 251, an imaging sequence with diffusion-weighting gradient magnetic fields having a plurality of different b values based on the spin echo EPI technique, for example, is specified as the reference scan by the operator.

Moreover, for an actual scan, to receive magnetic resonance signals at the second RF coil 214b (the surface coil) to be output to the actual scan image producing section 271, an imaging sequence based on the spin echo technique, for example, is specified by the operator. At that time, the operating section 32 outputs an operational signal based on the operation by the operator to the control section 25.

Then, at the image producing step ST21, the control section 25 controls the RF driving section 22, gradient driving section 23 and data collecting section 24 and drives the RF coil section 214 and gradient coil section 213 in the magnet system 21 based on the operational signal to sequentially conduct the reference scan and actual scan. The magnetic resonance signals from the subject 40 are then received by the second RF coil 214b, and the received magnetic resonance signals are correspondingly output to the first reference image producing section 231, second reference image producing section 241a, fourth reference image producing section 251 and actual scan image producing section 271, which then produce respective images. The reference images are then subjected to processing for removing noise based on a prespecified threshold.

First, at the image producing step ST21, as in Embodiment 2, the first reference image $Is_1(x, y)$ at the first echo time TE1 and the second reference image $Is_2(x, y)$ at the second echo time TE2 are produced corresponding to pixel positions $(x, y)$.

Moreover, at the image producing step ST21, as in Embodiment 2, the third reference image $Is_3(x, y)$ corresponding to pixel positions $(x, y)$ is produced based on magnetic resonance signals received in the first repetition time TR1, and the fourth reference image $Is_4(x, y)$ corresponding to pixel positions $(x, y)$ is produced based on magnetic resonance signals received in the second repetition time TR2.

In addition, at the image producing step ST21, the imaging sequence with gradient magnetic fields having a plurality of b values, i.e., with a gradient magnetic field b1 having a first b value and a gradient magnetic field b2 having a second b value different from the gradient magnetic field b1 having the first b value, is executed as the reference scan and magnetic resonance signals received at the second RF coil 214b (the surface coil) are output to the fourth reference image producing section 251. The fourth reference image producing section 251 is then used to produce a seventh reference image $Is_7(x, y)$ corresponding to pixel positions $(x, y)$ based on magnetic resonance signals received in the gradient magnetic field b1 having the first b value, and an eighth reference image $Is_8(x, y)$ corresponding to pixel positions $(x, y)$ based on magnetic resonance signals received in the gradient magnetic field having the second b value.

Next, at the T2 relaxation time calculating step ST22, as in Embodiment 2, the T2 relaxation time calculating section 232 calculates the T2 relaxation time $T2(x, y)$ corresponding to pixel positions (x, y) based on the first reference image $Is_1(x, y)$ and second reference image $Is_2(x, y)$ produced by the first reference image producing section 231.

Next, at the T1 relaxation time calculating step ST23, as in Embodiment 2, the third reference image $Is_3(x, y)$ and fourth reference image $Is_4(x, y)$ produced by the second reference image producing section 241a are subjected to fitting corresponding to the repetition times TR1 and TR2 by the T1 relaxation time calculating section 242 to calculate the T1 relaxation time T1(x, y) corresponding to pixel positions (x, y).

Next, at the apparent diffusion coefficient calculating step ST24, the apparent diffusion coefficient calculating section 252 calculates an apparent diffusion coefficient D(x, y) corresponding to pixel positions (x, y) based on the seventh reference image $Is_7(x, y)$ and eighth reference image $Is_8(x, y)$ produced by the fourth reference image producing section 251, according to Equation (8):

$$D(x, y) = -\text{Log}\{Is_7(x, y)/Is_8(x, y)\}/(b1-b2). \quad (8)$$

Next, at the spin density distribution calculating step ST25, the spin density distribution calculating section 233 is used to calculate a spin density distribution N(x, y) based on a combination of the T2 relaxation time T2(x, y) calculated by the T2 relaxation time calculating section 232, the T1 relaxation time T1(x, y) calculated by the T1 relaxation time calculating section 242, and the apparent diffusion coefficient D(x, y) calculated by the apparent diffusion coefficient calculating section 252 on the assumption that, for example, the spin density of the cerebrospinal fluid is 1.00 in a static magnetic field having intensity of 1.5 Teslas. For example, if T1(x, y):T2(x, y):D(x, y) falls within (450—less than 550 ms):(50—less than 80 ms):($0.6 \times 10^{-3}$—less than $0.8 \times 10^{-3}$ mm$^2$/s), the tissue at that pixel position (x, y) is determined to be white matter and a value of 0.61 is defined, which is the value of the spin density of white matter found in the literature. If T1(x, y):T2(x, y):D(x, y) falls within (550—less than 2000 ms):(80—less than 200 ms):($0.8 \times 10^{-3}$—less than $1.8 \times 10^{-3}$ mm$^2$/s), for example, the tissue at that pixel position (x, y) is determined to be gray matter and a value of 0.69 is defined, which is the value of the spin density of gray matter found in the literature. If T1(x, y):T2(x, y):D(x, y) falls within (2000 ms or more):(200 ms or more):($1.8 \times 10^{-3}$ mm$^2$/s or more), for example, the tissue at that pixel position (x, y) is determined to be cerebrospinal fluid and a value of 1.00 is defined, which is the value of the spin density of cerebrospinal fluid found in the literature. It should be noted that since the T2 relaxation time T2(x, y) and T1 relaxation time T1(x, y) are affected by the static magnetic field intensity in measurement, when the static magnetic field intensity has a value other than 1.5 Teslas, other spin density values found in the literature should be used to define the spin density.

Next, at the T2-weighted image calculating step ST26, as in Embodiment 2, the T2-weighted image calculating section 233 is used to produce a T2-weighted image $Ie_2(x, y)$ at the second echo time TE2 based on the T2 relaxation time T2(x, y) calculated by the T2 relaxation time calculating section 232 and the spin density distribution N(x, y) calculated by the spin density distribution calculating section 233.

Next, at the sensitivity distribution calculating step ST27, as in Embodiment 2, the sensitivity distribution calculating section 235 is used to calculate a sensitivity distribution H(x, y) of the second RF coil 214b (the surface coil) based on a combination of the T2-weighted image $Ie_2(x, y)$ and second reference image $Is_2(x, y)$ at the second echo time TE2. Thereafter, the sensitivity distribution H(x, y) is subjected to extrapolation or interpolation, and low-pass filtering in which lower frequency components are passed.

Next, at the correction step ST28, as in Embodiment 2, the tomographic image Isa(x, y) produced by the actual scan is corrected by the correcting section 236 based on the sensitivity distribution H(x, y) calculated by the sensitivity distribution calculating section 235. The correcting section 236 corrects the tomographic image Isa(x, y) produced by the actual scan, and outputs the corrected tomographic image Isa'(x, y) to the display section 33.

Next, at the display step ST29, as in Embodiment 2, a tomographic image of the subject 40 is displayed on the display section 33 based on the corrected tomographic image Isa'(x, y). In this way, the magnetic resonance imaging method of the present embodiment calculates the sensitivity distribution of the second RF coil 214B serving as a receive coil by a reference scan, and uses the calculated sensitivity distribution to correct non-uniformity of a tomographic image by an actual scan for display.

As described above, according to the present embodiment, based on magnetic resonance signals from an imaged region received by the second RF coil 214b in a predefined imaging sequence with diffusion-weighting gradient magnetic fields b1 and b2 having a plurality of different b values in a reference scan, the fourth reference image producing section 251 produces reference images $Is_7(x, y)$ and $Is_8(x, y)$ that correspond to diffusion-weighted images in the diffusion-weighting gradient magnetic fields having the plurality of different b values. The apparent diffusion coefficient calculating section 252 then calculates an apparent diffusion coefficient D(x, y) based on the plurality of reference images $Is_7(x, y)$ and $Is_8(x, y)$ produced by the fourth reference image producing section 251. The spin density distribution calculating section 233 then calculates a spin density distribution based on the T2 relaxation time T2(x, y) calculated by the T2 relaxation time calculating section 232, T1 relaxation time T1(x, y) calculated by the T1 relaxation time calculating section 242, and, in addition, the apparent diffusion coefficient D(x, y) calculated by the apparent diffusion coefficient calculating section 252. According to the present embodiment, since the spin density distribution N(x, y) is calculated based on the apparent diffusion coefficient D(x, y) in addition to the T2 relaxation time T2(x, y) and T1 relaxation time T1(x, y), an accurate spin density distribution N(x, y) can be calculated, and therefore, an accurate sensitivity distribution H(x, y) is easily calculated, thereby facilitating accurate tomographic imaging on the subject.

Embodiment 4

The configuration of a magnetic resonance imaging apparatus of Embodiment 4 in accordance with the present invention will be described hereinbelow.

Figure 9:
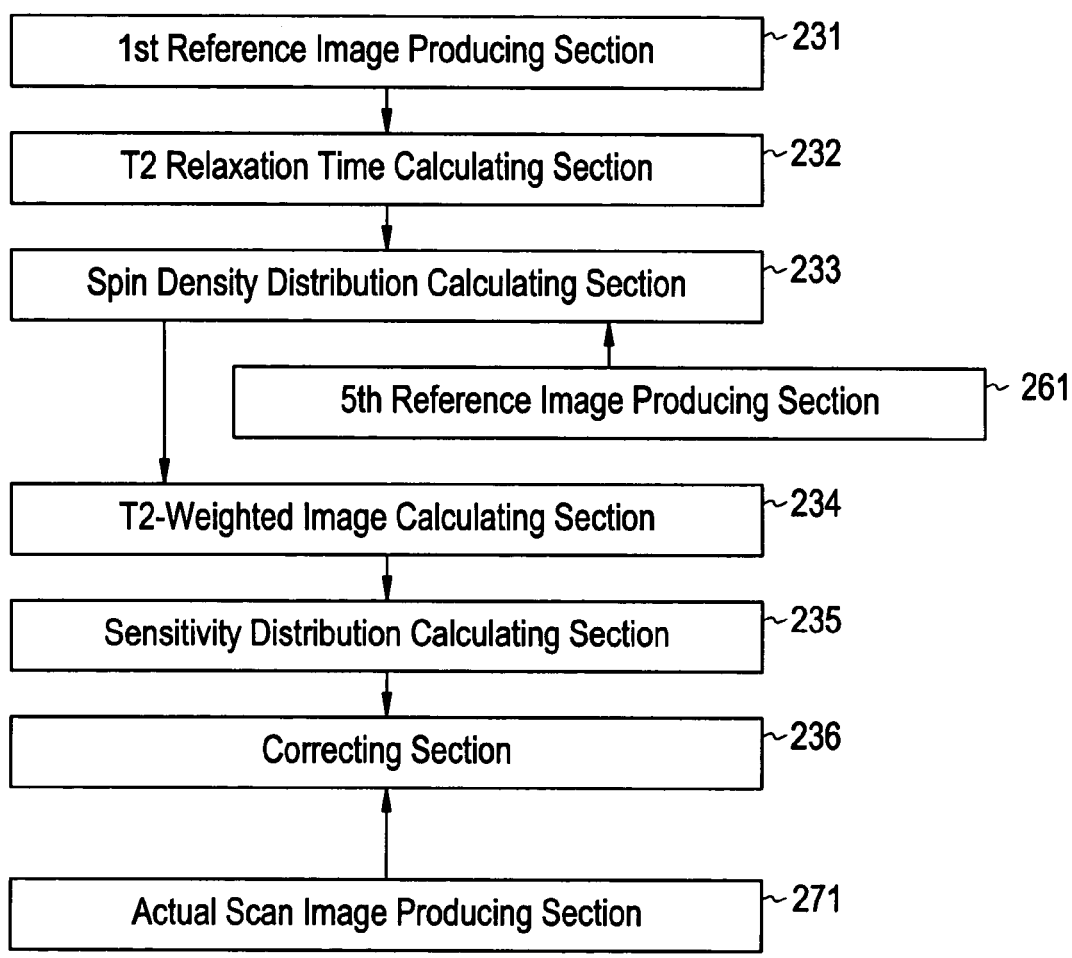
FIG. 9 is a block diagram showing components executing image processing in a data processing section in Embodiment 4 in accordance with the present invention.

FIG. 9 is a block diagram showing components executing image processing in the data processing section 31 in Embodiment 4.

As shown in FIG. 9, the data processing section 31 comprises the first reference image producing section 231, T2 relaxation time calculating section 232, spin density distribution calculating section 233, T2-weighted image calculating section 234, sensitivity distribution calculating section 235, correcting section 236, a fifth reference image producing section 261, and the actual scan image producing section 271.

The magnetic resonance imaging apparatus of Embodiment 4 is similar to that of Embodiment 1 except that it has the fifth reference image producing section 261. Therefore, explanation of redundant portions will be omitted.

The fifth reference image producing section 261 of the present embodiment corresponds to the fifth reference image producing means of the present invention.

These components will be described one by one hereinbelow.

The fifth reference image producing section 261 produces a plurality of reference images based on magnetic resonance signals from the imaged region received by the first RF coil, which is the volume coil, in a predefined imaging sequence with a plurality of different echo times in a reference scan. For example, the fifth reference image producing section 261 produces a ninth reference image $Is_9(x, y)$ based on magnetic resonance signals received by the second RF coil 214b at a third echo time TE3 in a reference scan according to the fast spin echo technique, and a tenth reference image $Is_{10}(x, y)$ based on magnetic resonance signals received at a fourth echo time TE4 different from the third echo time TE3. The ninth reference image $Is_9(x, y)$ and tenth reference image $Is_{10}(x, y)$ are produced by similar imaging sequences except that the third echo time TE3 and fourth echo time TE4 are different. Preferably, the fifth reference image producing section 261 produces reference images to have spin density weighted (proton density weighted) using magnetic resonance signals received in a pulse sequence that has a shorter echo time than that in the aforementioned first reference image producing section 231 so that the spin density distribution calculating section 233 can calculate a spin density N(x, y).

Unlike in Embodiment 1, the spin density distribution calculating section 233 calculates the spin density N(x, y) of the imaged region in the subject 40 based on the plurality of reference images produced by the fifth reference image producing section 261.

Now description will be made on a magnetic resonance imaging method for capturing a tomographic image of the imaged region in the subject 40 using the magnetic resonance imaging apparatus 1 of the present embodiment.

FIG. 10 is a flow chart showing the magnetic resonance imaging method of the present embodiment.

As shown in FIG. 10, the magnetic resonance imaging method of the present embodiment sequentially executes the image producing step ST21, T2 relaxation time calculating step ST22, spin density distribution calculating step ST25, T2-weighted image calculating step ST26, sensitivity distribution calculating step ST27, correction step ST28, and display step ST29. The magnetic resonance imaging method of the present embodiment comprises steps similar to those of Embodiment 1.

Now the steps will be described one by one hereinbelow.

Similarly to in Embodiment 1, prior to the aforementioned steps, the subject 40 is first rested on the cradle 26. Thereafter, the RF coil section 214 is fitted over the head of the subject 40. The cradle 26 on which the subject 40 is laid is driven by the cradle driving section, and inserted into the bore 211 in which a static magnetic field is generated by the static magnetic field magnet section 212; the imaged region in the subject 40 is thus positioned in the central portion of the bore 211.

Then, information for imaging is input to the operating section 32 by the operator. In the present embodiment, to receive magnetic resonance signals by the second RF coil 214b (the surface coil) to be output to the first reference image producing section 231 and second reference image producing section 241a at the image producing step ST21, which will be described below, corresponding imaging sequences are specified as a reference scan by the operator.

Specifically, to receive magnetic resonance signals at the second RF coil 214b (the surface coil) to be output to the first reference image producing section 231, an imaging sequence with a plurality of different echo times based on the fast spin echo technique, for example, is specified as a reference scan by the operator.

Moreover, to receive magnetic resonance signals at the first RF coil 214a (the volume coil) to be output to the fifth reference image producing section 261, an imaging sequence with a plurality of different echo times based on the spin echo technique, for example, is specified as the reference scan by the operator.

Furthermore, for an actual scan, to receive magnetic resonance signals at the second RF coil 214b (the surface coil) to be output to the actual scan image producing section 271, an imaging sequence based on the spin echo technique, for example, is specified by the operator. At that time, the operating section 32 outputs an operational signal based on the operation by the operator to the control section 25.

Then, at the image producing step ST21, as in Embodiment 1, the control section 25 controls the RF driving section 22, gradient driving section 23 and data collecting section 24 and drives the RF coil section 214 and gradient coil section 213 in the magnet system 21 based on the operational signal to sequentially conduct the reference scan and actual scan. The magnetic resonance signals from the subject 40 are then received by the second RF coil 214b, and the received magnetic resonance signals are correspondingly output to the first reference image producing section 231, second reference image producing section 241a and actual scan image producing section 271, which then produce respective images. The reference images are then subjected to processing for removing noise based on a prespecified threshold.

First, at the image producing step ST21, as in Embodiment 1, the first reference image $Is_1(x, y)$ at the first echo time TE1 and the second reference image $Is_2(x, y)$ at the second echo time TE2 are produced corresponding to pixel positions (x, y).

Moreover, at the image producing step ST21, an imaging sequence for receiving magnetic resonance signals to be directed to the fifth reference image producing section 261 is executed. In this case, the control section 25 executes an imaging sequence according to the fast spin echo technique with a plurality of echo times, i.e., a third echo time TE3 and a fourth echo time TE4 different from the third echo time TE3, for example, in a reference scan, and outputs magnetic resonance signals received at the first RF coil 214a (the volume coil) to the fifth reference image producing section 261. The fifth reference image producing section 261 is then used to produce the ninth reference image $Is_9(x, y)$ corresponding to pixel positions (x, y) based on magnetic resonance signals received at the third echo time TE3, and the tenth reference image $Is_{10}(x, y)$ corresponding to pixel positions (x, y) based on magnetic resonance signals received at the fourth echo time TE4.

Next, at the T2 relaxation time calculating step ST22, as in Embodiment 1, the T2 relaxation time calculating section 232 calculates a T2 relaxation time T2(x, y) corresponding to pixel positions (x, y) based on the first reference image $Is_1(x, y)$ and second reference image $Is_2(x, y)$ produced by the first reference image producing section 231.

Next, at the spin density distribution calculating step ST25, the spin density distribution calculating section 233 is used to calculate a spin density distribution N(x, y) of the imaged region in the subject 40 based on the plurality of reference images, i.e., the ninth reference image $Is_9(x, y)$ and tenth reference image $Is_{10}(x, y)$, produced by the fifth reference image producing section 261. For example, the spin density distribution calculating section 233 conducts fitting corresponding to the echo times TE3 and TE4 on the ninth reference image $Is_9(x, y)$ and tenth reference image $Is_{10}(x, y)$ produced by the fifth reference image producing section 261, and calculates the spin density distribution $N(x, y)$ corresponding to pixel positions $(x, y)$.

Next, at the T2-weighted image calculating step ST26, as in Embodiment 1, the T2-weighted image calculating section 233 is used to produce a T2-weighted image $Ie_2(x, y)$ at the second echo time TE2 based on the T2 relaxation time $T2(x, y)$ calculated by the T2 relaxation time calculating section 232 and the spin density distribution $N(x, y)$ calculated by the spin density distribution calculating section 233.

Next, at the sensitivity distribution calculating step ST27, as in Embodiment 1, the sensitivity distribution calculating section 235 is used to calculate a sensitivity distribution $H(x, y)$ of the second RF coil 214*b* (the surface coil) based on a combination of the T2-weighted image $Ie_2(x, y)$ and second reference image $Is_2(x, y)$ at the second echo time TE2. Thereafter, the sensitivity distribution $H(x, y)$ is subjected to extrapolation or interpolation, and low-pass filtering in which lower frequency components are passed.

Next, at the correction step ST28, as in Embodiment 1, the tomographic image $Isa(x, y)$ produced by the actual scan is corrected by the correcting section 236 based on the sensitivity distribution $H(x, y)$ calculated by the sensitivity distribution calculating section 235. The correcting section 236 corrects the tomographic image $Isa(x, y)$ produced by the actual scan, and outputs the corrected tomographic image $Isa'(x, y)$ to the display section 33.

Next, at the display step ST29, as in Embodiment 1, a tomographic image of the subject 40 is displayed on the display section 33 based on the corrected tomographic image $Isa'(x, y)$. In this way, the magnetic resonance imaging method of the present embodiment calculates the sensitivity distribution of the second RF coil 214B serving as a receive coil by a reference scan, and uses the calculated sensitivity distribution to correct non-uniformity of a tomographic image by an actual scan for display.

As described above, according to the present embodiment, based on magnetic resonance signals from an imaged region received by the first RF coil 214*a* (the volume coil) in a predefined imaging sequence with a plurality of different echo times in a reference scan, the fifth reference image producing section 261 produces reference images $Is_9(x, y)$ and $Is_{10}(x, y)$ that correspond to spin density weighted images at the plurality of different echo times. Then, the spin density calculating section 233 calculates the spin density in the imaged region in the subject based on the plurality of reference images $Is_9(x, y)$ and $Is_{10}(x, y)$ produced by the fifth reference image producing section 261. Since in the present embodiment, the spin density distribution $N(x, y)$ is directly calculated based on the reference images $Is_9(x, y)$ and $Is_{10}(x, y)$ that correspond to spin density weighted images, an accurate sensitivity distribution $H(x, y)$ is easily calculated, thereby facilitating accurate tomographic imaging on the subject.

It should be noted that the present invention is not limited to being practiced according to the aforementioned embodiments, and several variations may be employed.

For example, while in the embodiments, the T2-weighted image producing means calculates the T2-weighted image based on two factors, the T2 relaxation time from the T2 relaxation time calculating means and the spin density distribution from the spin density distribution calculating means, the T2-weighted image is preferably calculated based only on the T2 relaxation time if the spin density in the imaged region in the subject is in uniform distribution. This reduces the number of reference scans needed for calculating the spin density distribution and the volume of calculation for calculating the T2-weighted image, and therefore, an accurate sensitivity distribution of the receive coil is easily calculated, thereby facilitating accurate tomographic imaging on the subject.

any widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus for correcting a tomographic image of an imaged region of a subject produced based on magnetic resonance signals received by a receive coil in an actual scan, with reference to a sensitivity distribution of said receive coil in said imaged region created in a reference scan, said apparatus comprising:
   a first reference image producing device for, based on said magnetic resonance signals from said imaged region received by said receive coil in a predefined imaging sequence with a plurality of different echo times in said reference scan, producing reference images respectively at said plurality of different echo times;
   a T2 relaxation time calculating device for calculating a T2 relaxation time based on the plurality of reference images produced by said first reference image producing device;
   a T2-weighted image calculating device for calculating a T2-weighted image at one of said plurality of different echo times based on the T2 relaxation time calculated by said T2 relaxation time calculating device; and
   a sensitivity distribution calculating device for calculating said sensitivity distribution based on the reference image produced by said first reference image producing device at the echo time used when said T2-weighted image calculating device calculated said T2-weighted image, and on said T2-weighted image calculated by said T2-weighted image calculating device.

2. The magnetic resonance imaging apparatus of claim 1, wherein:
   said first reference image producing device employs a fast spin echo technique as said predefined imaging sequence.

3. The magnetic resonance imaging apparatus of claim 1, further comprising:
   a spin density distribution calculating device for calculating a spin density distribution based on the T2 relaxation time calculated by said T2 relaxation time calculating device,
   wherein said T2-weighted image calculating device produces said T2-weighted image further based on the spin density distribution calculated by said spin density distribution calculating device.

4. The magnetic resonance imaging apparatus of claim 3, further comprising:
   a second reference image producing device for, based on said magnetic resonance signals from said imaged region received by said receive coil in an imaging sequence with a plurality of different repetition times according to a saturation recovery method in said reference scan, producing reference images respectively in said plurality of different repetition times; and a T1 relaxation time calculating device for calculating a T1 relaxation time based on the plurality of reference images produced by said second reference image producing device, wherein said spin density distribution calculating device calculates the spin density distribution further based on the T1 relaxation time calculated by said T1 relaxation time calculating device.

5. The magnetic resonance imaging apparatus of claim 3, further comprising:

a third reference image producing device for, based on said magnetic resonance signals from said imaged region received by said receive coil in an imaging sequence with a plurality of different inversion times according to an inversion recovery method in said reference scan, producing reference images respectively in said plurality of different inversion times; and a T1 relaxation time calculating device for calculating a T1 relaxation time based on the plurality of reference images produced by said third reference image producing device, wherein said spin density distribution calculating device calculates the spin density distribution further based on the T1 relaxation time calculated by said T1 relaxation time calculating device.

6. The magnetic resonance imaging apparatus of claim 3, further comprising:

a fourth reference image producing device for, based on said magnetic resonance signals from said imaged region received by said receive coil in a predefined imaging sequence with diffusion-weighting gradient magnetic fields having a plurality of different b values in said reference scan, producing reference images respectively in said diffusion-weighting gradient magnetic fields having the plurality of different b values; and an apparent diffusion coefficient calculating device for calculating an apparent diffusion coefficient based on the plurality of reference images produced by said fourth reference image producing device, wherein said spin density distribution calculating device calculates the spin density distribution further based on the apparent diffusion coefficient calculated by said apparent diffusion coefficient calculating device.

7. The magnetic resonance imaging apparatus of claim 1, wherein:

a surface coil is employed as said receive coil.

8. The magnetic resonance imaging apparatus of claim 1, further comprising:

a fifth reference image producing device for, based on said magnetic resonance signals from said imaged region received by said receive coil in a predefined imaging sequence with a plurality of different echo times in said reference scan, producing reference images respectively at said plurality of different echo times; and a spin density distribution calculating device for calculating a spin density in said imaged region of said subject based on the plurality of reference images produced by said fifth reference image producing device;

wherein said T2-weighted image calculating device produces said T2-weighted image further based on the spin density distribution calculated by said spin density distribution calculating device.

9. The magnetic resonance imaging apparatus of claim 8, further comprising:

as said receive coil, a first receive coil and a second receive coil having a more uniform sensitivity distribution in said imaged region than that of said first receive coil, wherein in said actual scan, said tomographic image is produced based on said magnetic resonance signals received by said first receive coil;

said first reference image producing device produces the plurality of reference images based on said magnetic resonance signals received by said first receive coil; and said fifth reference image producing device produces the plurality of reference images based on said magnetic resonance signals received using said second receive coil.

10. The magnetic resonance imaging apparatus of claim 9, wherein:

a surface coil is employed as said first receive coil; and
a volume coil is employed as said second receive coil.

11. A magnetic resonance imaging method for correcting a tomographic image of an imaged region of a subject produced based on magnetic resonance signals received by a receive coil in an actual scan, with reference to a sensitivity distribution of said receive coil in said imaged region created in a reference scan, said method comprising:

a first reference image producing step of, based on said magnetic resonance signals from said imaged region received by said receive coil in a predefined imaging sequence with a plurality of different echo times in said reference scan, producing reference images respectively at said plurality of different echo times;

a T2 relaxation time calculating step of calculating a T2 relaxation time based on the plurality of reference images produced by said first reference image producing step;

a T2-weighted image calculating step of calculating a T2-weighted image at one of said plurality of different echo times based on the T2 relaxation time calculated by said T2 relaxation time calculating step; and a sensitivity distribution calculating step of calculating said sensitivity distribution based on the reference image produced by said first reference image producing step at the echo time used when calculating said T2-weighted image by said T2-weighted image calculating step, and on said T2-weighted image calculated by said T2-weighted image calculating step.

12. The magnetic resonance imaging method of claim 11, wherein:

said first reference image producing step employs a fast spin echo technique as said predefined imaging sequence.

13. The magnetic resonance imaging method of claim 11, further comprising:

a spin density distribution calculating step of calculating a spin density distribution based on the T2 relaxation time calculated by said T2 relaxation time calculating step, wherein said T2-weighted image calculating step produces said T2-weighted image further based on the spin density distribution calculated by said spin density distribution calculating step.

14. The magnetic resonance imaging method of claim 13, further comprising:

a second reference image producing step of, based on said magnetic resonance signals from said imaged region received by said receive coil in an imaging sequence with a plurality of different repetition times according to a saturation recovery method in said reference scan, producing reference images respectively in said plurality of different repetition times; and a T1 relaxation time calculating step of calculating a T1 relaxation time based on the plurality of reference images produced by said second reference image producing step, wherein said spin density distribution calculating step calculates the spin density distribution further based on the T1 relaxation time calculated by said T1 relaxation time calculating step.

15. The magnetic resonance imaging method of claim 13, further comprising:

a third reference image producing step of, based on said magnetic resonance signals from said imaged region received by said receive coil in an imaging sequence with a plurality of different inversion times according to an inversion recovery method in said reference scan, producing reference images respectively in said plurality of different inversion times; and a T1 relaxation time calculating step of calculating a T1 relaxation time based on the plurality of reference images produced by said third reference image producing step, wherein said spin density distribution calculating step calculates the spin density distribution further based on the T1 relaxation time calculated by said T1 relaxation time calculating step.

16. The magnetic resonance imaging method of claim 13, further comprising:

a fourth reference image producing step of, based on said magnetic resonance signals from said imaged region received by said receive coil in a predefined imaging sequence with diffusion-weighting gradient magnetic fields having a plurality of different b values in said reference scan, producing reference images respectively in said diffusion-weighting gradient magnetic fields having the plurality of different b values; and an apparent diffusion coefficient calculating step of calculating an apparent diffusion coefficient based on the plurality of reference images produced by said fourth reference image producing step, wherein said spin density distribution calculating step calculates the spin density distribution further based on the apparent diffusion coefficient calculated by said apparent diffusion coefficient calculating step.

17. The magnetic resonance imaging method of claim 11, wherein:

a surface coil is employed as said receive coil.

18. The magnetic resonance imaging method of claim 11, further comprising:

a fifth reference image producing step of, based on said magnetic resonance signals from said imaged region received by said receive coil in a predefined imaging sequence with a plurality of different echo times in said reference scan, producing reference images respectively at said plurality of different echo times; and a spin density calculating step for calculating a spin density in said imaged region of said subject based on the plurality of reference images produced by said fifth reference image producing step;

wherein said T2-weighted image calculating step produces said T2-weighted image further based on the spin density distribution calculated by said spin density distribution calculating step.

19. The magnetic resonance imaging method of claim 18, wherein:

in said actual scan, a first receive coil is used as said receive coil to receive said magnetic resonance signals, said first reference image producing step produces the plurality of reference images based on said magnetic resonance signals received by said first receive coil; and said fifth reference image producing step produces the plurality of reference images based on said magnetic resonance signals received using a second receive coil having a more uniform sensitivity distribution in said imaged region than that of said first receive coil as said receive coil.

20. The magnetic resonance imaging method of claim 19, wherein:

a surface coil is employed as said first receive coil; and a volume coil is employed as said second receive coil.

* * * * *